(12) United States Patent
Padullaparthi

(10) Patent No.: US 9,716,368 B2
(45) Date of Patent: Jul. 25, 2017

(54) TUNABLE OPTICAL PHASE FILTER

(71) Applicant: SAE Magnetics (H.K.) Ltd., Hong Kong (CN)

(72) Inventor: Babu Dayal Padullaparthi, Hong Kong (CN)

(73) Assignee: SAE MAGNETICS (H.K.) LTD., Hong Kong (CN)

(*) Notice: Subject to any disclaimer, the term of this patent is extended or adjusted under 35 U.S.C. 154(b) by 0 days.

(21) Appl. No.: 14/956,888

(22) Filed: Dec. 2, 2015

(65) Prior Publication Data
US 2017/0005455 A1 Jan. 5, 2017

Related U.S. Application Data

(63) Continuation-in-part of application No. 14/790,208, filed on Jul. 2, 2015, now abandoned.

(51) Int. Cl.
*H01S 5/00* (2006.01)
*H01S 5/183* (2006.01)
*H01S 5/343* (2006.01)

(52) U.S. Cl.
CPC ...... *H01S 5/18386* (2013.01); *H01S 5/18391* (2013.01); *H01S 5/18311* (2013.01); *H01S 5/3434* (2013.01); *H01S 5/34313* (2013.01)

(58) Field of Classification Search
CPC ............ H01S 5/18361; H01S 5/18386; H01S 5/0282; H01S 5/187; H01S 5/18313; H01S 5/3434; H01S 5/34313; H01S 5/0425

See application file for complete search history.

(56) References Cited

U.S. PATENT DOCUMENTS 6,127,691 A * 10/2000 Fukunaga ............ B82Y 20/00
                                                                257/17
8,900,902 B2    12/2014 Uchida
(Continued)

OTHER PUBLICATIONS

Andreas Molitor et al. ("Investigations on the Intensity Noise of Surface Grating Relief VCSELs", IEEE Journal of Quantum Electronics, vol. 46, No. 4, Apr. 2010).*
(Continued)

*Primary Examiner* — Yuanda Zhang
(74) *Attorney, Agent, or Firm* — Nixon & Vanderhye P.C.

(57) ABSTRACT

An embodiment provides a 850 nm VCSEL transmitter that includes an active region having: one or more quantum wells having InGaAs material; and two or more quantum well barriers having AlGaAs or GaAsP materials adjacent to the one or more quantum wells. An in-phase or anti-phase, step or ring surface relief structure depth control is made on either (i) the topmost GaAs surface/contact layers by either dry or wet etching, or (ii) with the help of PECVD made thin SiN layer made on GaAs layer with wet etching for tunable static and dynamic characteristics such as output power, slope efficiency, and resonance oscillation bandwidth, photon lifetime through its damping, rise/fall times of eye-opening, over shooting, and jitter respectively. Moreover, anti-phase surface relief structure diameter control can be made on the topmost GaAs step surface/contact, or SiN ring layers for filtering of higher order modes and reduction of spectral line width.

19 Claims, 20 Drawing Sheets

(56) References Cited

U.S. PATENT DOCUMENTS

| | | | | |
|---|---|---|---|---|
| 2009/0161713 A1* | 6/2009 | Duggan | ............... | B82Y 20/00 |
| | | | | 372/45.01 |
| 2011/0165712 A1* | 7/2011 | Uchida | ............... | H01S 5/2081 |
| | | | | 438/34 |
| 2013/0223465 A1* | 8/2013 | Uchida | ............... | H01S 5/2081 |
| | | | | 372/50.12 |
| 2015/0023380 A1* | 1/2015 | Shigihara | ............... | H01S 5/222 |
| | | | | 372/45.01 |

OTHER PUBLICATIONS

Erik Haglund et al., "Reducing the Spectral Width of High Speed Oxide confined VCSELs Using an Integrated Mode Filter," Proceedings of SPIE, vol. 8276, Copyright 2012, 8 pages.

Emanuel P. Haglund, "Impact of Damping on High-Speed Large Signal VCSEL Dynamics," Journal of Lightwave Technology, vol. 33, No. 4, Feb. 15, 2015, pp. 795-801.

Petter Westbergh et al., "Impact of Photon Lifetime on High-Speed VCSEL Performance," IEEE Journal of Selected Topics in Quantum Electronics, vol. 17, No. 6, Nov./Dec. 2011, pp. 1603-1612.

Pierluigi Debernardi et al., "Surface Relief Versus Standard VCSELs: A Comparison Between Experimental and Hot-Cavity Model Results," IEEE Journal of Selected Topics in Quantum Electronics, vol. 15, No. 3, May/Jun. 2009, pp. 828-837.

Daniel M. Kuchta et al., "A 71 Gb/s NRZ Modulated 850 nm VCSEL-based Optical Link," IEEE Photonics Technology Letters, copyright 2013, pp. 1-4.

U.S. Appl. No. 14/701,978, filed May 1, 2015.

* cited by examiner

800

| Condition | Power (W) | | Gas Flow (SCCM) | | | Pressure mTorr | GaAs Etch rate (nm/min) |
|---|---|---|---|---|---|---|---|
| | UW | RF | Cl2 | BCl3 | Ar | | |
| 1 | 400 | 20 | 40 | 75 | 25 | 5 | 83.3 |
| 2 | 400 | 20 | 40 | 75 | 25 | 1 | 41.3 |
| 3 | 400 | 20 | 24 | 45 | 100 | 3 | 24.6 |
| 4 | 400 | 20 | 24 | 45 | 200 | 5 | 19.9 |

FIG. 8

| Wafer-1<br>SR depth Target<br>: 20 nm | Vop@6mA<br>(V) | Pf@6mA<br>(mW) | Rs (Ω)<br>(4~8mA) | SE (W/A)<br>(2~6mA) | Ith (mA)<br>(1-3mA) | FFD (°) | Spectrum<br>width<br>(Δλ;nm) | Wavelength<br>(λ; nm) |
|---|---|---|---|---|---|---|---|---|
| SR=0um | 2.07 | 2.58 | 51.27 | 0.45 | 0.41 | 21.41 | 0.22 | 844.83 |
| SR=2um | 2.08 | 2.64 | 51.70 | 0.46 | 0.40 | 21.68 | 0.21 | 845.12 |
| SR=4um | 2.08 | 2.97 | 52.07 | 0.52 | 0.41 | 22.51 | 0.13 | 844.67 |
| SR=6um | 2.09 | 3.45 | 53.01 | 0.61 | 0.44 | 23.03 | 0.21 | 844.69 |
| SR=7um | 2.13 | 3.51 | 53.55 | 0.62 | 0.51 | 22.33 | 0.18 | 844.73 |
| Wafer-2<br>SR depth target<br>: 36 nm | Vop@6mA<br>(V) | Pf@6mA<br>(mW) | Rs (Ω)<br>(4~8mA) | SE (W/A)<br>(2~6mA) | Ith (mA)<br>(1-3mA) | FFD (°) | Spectrum<br>width<br>(Δλ;nm) | Wavelength<br>(λ; nm) |
| SR=0um | 2.06 | 2.67 | 51.60 | 0.47 | 0.41 | 22.80 | 0.35 | 847.82 |
| SR=2um | 2.05 | 2.95 | 51.79 | 0.52 | 0.44 | 21.50 | 0.33 | 846.48 |
| SR=4um | 2.05 | 3.31 | 52.42 | 0.61 | 0.61 | 25.02 | 0.26 | 846.50 |
| SR=6um | 2.06 | 4.45 | 54.82 | 0.88 | 0.88 | 30.32 | 0.36 | 846.66 |
| SR=7um | 2.07 | 4.46 | 55.77 | 0.88 | 0.87 | 28.88 | 0.41 | 847.03 |

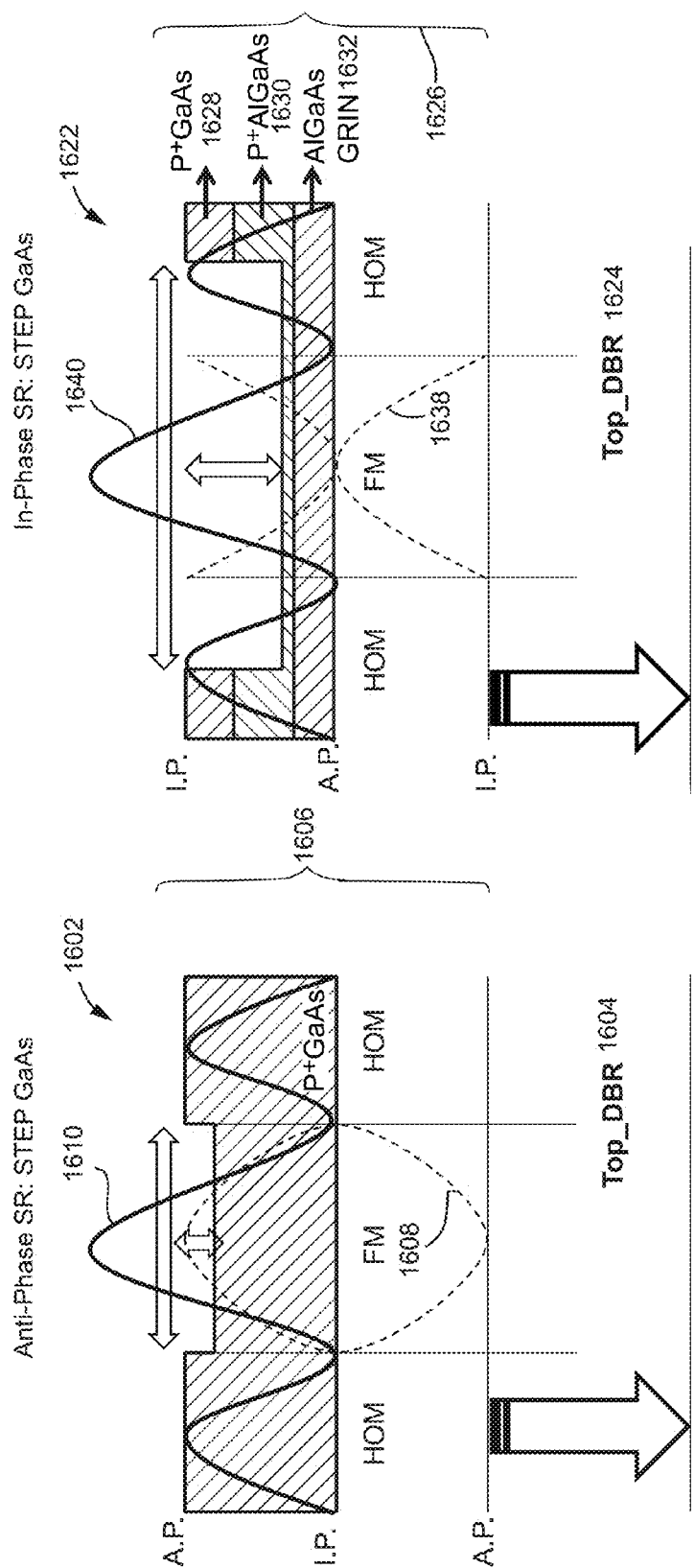

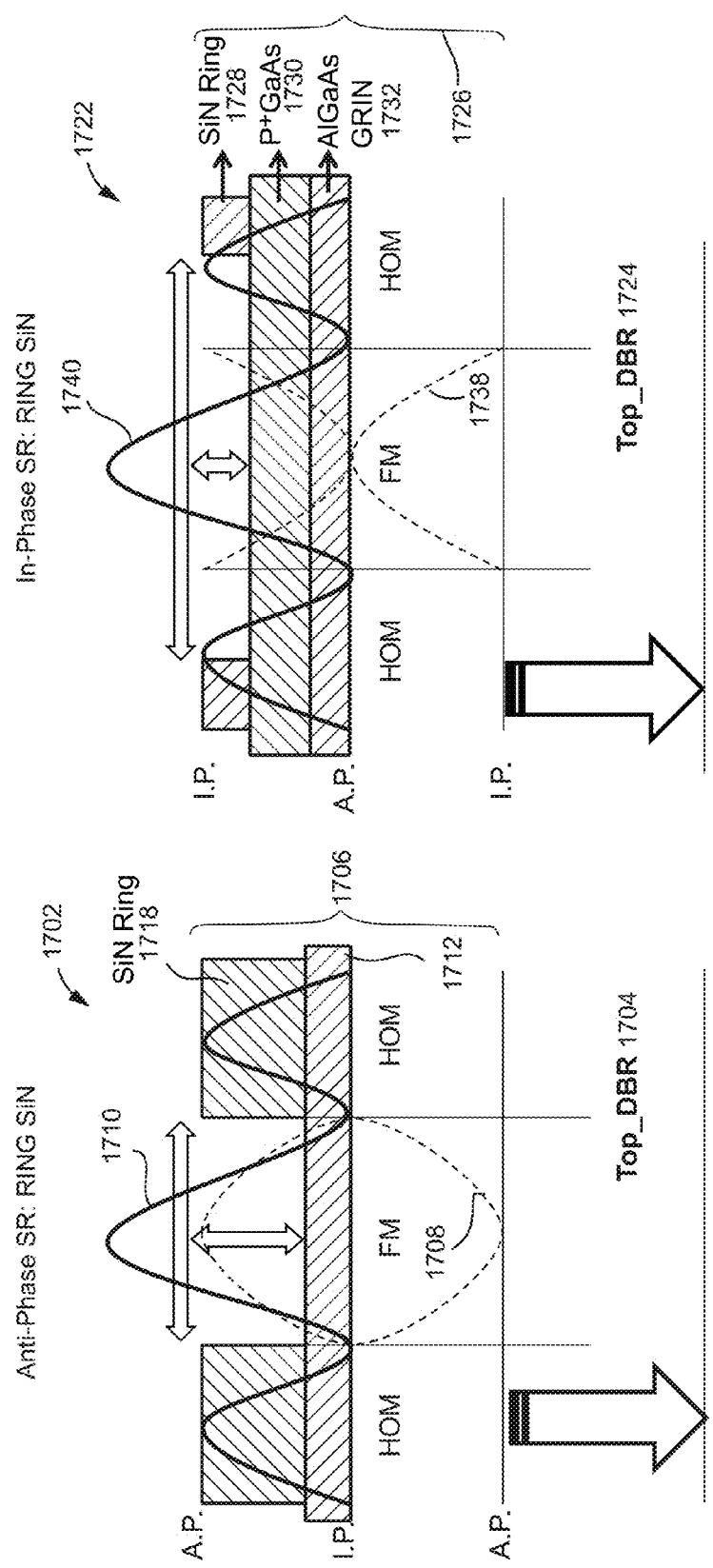

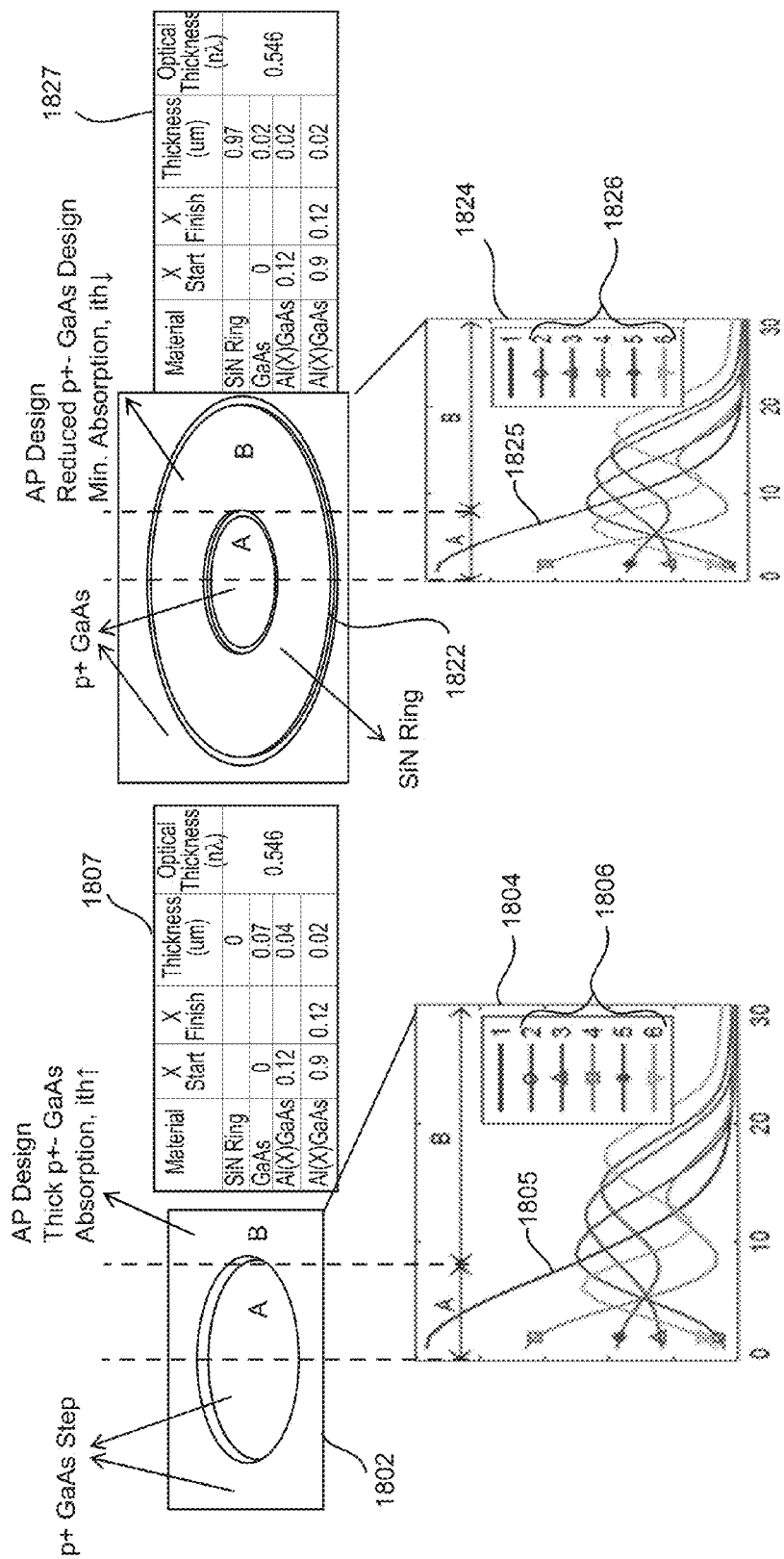

Allowable etch depth margins for various Surface Relief Phase conditions

| Optical Property/condition | STEP or RING surface relief | |
|---|---|---|
| | GaAs (n=3.5) | SiN (n=2.0) |
| Refractive Index (at 850 nm) | ≈ 3.5 | ≈ 2.0 |
| Optical Thickness ( λ=850 nm) | 242.8 nm | 425 nm |
| Material Growth Technique | MOCVD | PECVD |
| Anti - Phase (etch depth) | 40-50 | 100-150 |
| In-Phase (etch depth) | 20-40 | 40-55 |

FIG. 21

TUNABLE OPTICAL PHASE FILTER

CROSS-REFERENCE TO RELATED APPLICATIONS

This application is a continuation-in-part (CIP) of U.S. patent application Ser. No. 14/790,208 filed on Jul. 2, 2015, the entire contents of which are incorporated herein by reference.

TECHNICAL FIELD

Certain example embodiments described herein relate to surface-emitting laser elements and the like, and methods for manufacturing such elements.

BACKGROUND AND SUMMARY OF CERTAIN EXAMPLE EMBODIMENTS

Surface-emitting laser elements (or vertical cavity surface-emitting laser elements—VCSELs) are characterized in that laser light can be emitted in a perpendicular direction to the principal surface of a substrate formed with the element and in that the element has low threshold current and high power conversion efficiency. In addition, surface-emitting laser elements have various advantages, for example, that they emit circular light whose cross-section perpendicular to the optical axis is circular, that two-dimensional arrangement of them is facilitated, and that on-wafer inspection of them can be carried out efficiently. A VCSEL is suitable for use as the light source in various consumer applications including, for example, an image forming apparatus, an optical pickup device, the optical communication data transmitter of optical interconnections and optical modules, etc. Optical modules made with VCSELs also have applications in high-speed data transmission. At least in part due to such advantages, it is expected that the demand for surface-emitting laser elements as light sources for high-speed data communications will increase in the future.

In using a surface-emitting laser element for a light source for high speed data communication applications, it is generally desirable for the element to have a structure optimized for operating at high speed. In order for the surface-emitting laser element to accomplish a high-speed operation 10-40 Gbit/s and above, for example, it is especially desirable to optimize or otherwise improve characteristics of the optical transmission source such as control of photon lifetime, control of photon relaxation oscillation damping behavior and filtering of transverse optical modes that contribute to achieving an optimal and stable dynamic performance of a laser.

Certain example embodiments, as described below, help address these and/or other aspects.

Some embodiments provide an optical phase element that controls photon lifetime & relaxation oscillation damping behavior and filters transverse optical modes for best dynamic performance of a laser for high-speed data-transfer applications. Some embodiments include semiconductor lasers, such as VCSELs at 850 nm emission wavelength, integrated with tunable optical phase filters as reliable optical transmitters that have high potential in high-speed data communication for short reach applications.

An example embodiment provides a 850 nm VCSEL transmitter which includes an active region having one or more quantum wells having InGaAs material and two or more quantum well barriers having AlGaAs or GaAsP materials adjacent to the one or more quantum wells. A surface relief structure is made on either i) the topmost GaAs surface/contact layers by either dry or wet etching or ii) with the help of PECVD made thin SiN layer made on GaAs layer with wet etching for tunable static and dynamic characteristics such as output power, slope efficiency, and resonance oscillation bandwidth, photon lifetime through its damping, rise/fall times of eye-opening, over shooting, and jitter respectively.

According to an example embodiment, a vertical cavity surface-emitting laser element (VCSEL) comprises a top distributed Bragg reflector (DBR) and a bottom DBR each made with multiple layers of semiconductor thin films, an active region having at least one quantum well and at least one quantum well barrier each having a thickness of 3-10 nm formed between the top DBR and the bottom DBR, and a surface relief structure formed on at least the top-most layer of the top DBR by dry or wet etching of semiconductor or dielectric thin films. The at least one quantum well comprises InGaAs with an In proportion of 0.04-0.12, the at least one quantum well barrier comprises AlxGaAs where x is between 0.3-0.4 or GaAsPy where y is between 0.2-0.3, and the at least one quantum well is adjusted for a photoluminescence emission target between 835-840 nm. The surface relief structure has a depth of 20-150 nm and a diameter of 2-6 um, and the top surface of the top-most layer is terminated (1) either in-phase or anti-phase in relation to a standing wave corresponding to the VCSEL, and/or (2) in a layer having a fixed thickness in between the anti-phase and in-phase condition of the standing wave.

According to an example embodiment, a VCSEL comprises a top DBR and a bottom DBR each made with multiple layers of semiconductor thin films, an active region having at least one quantum well and at least one quantum well barrier each having a thickness of 3-10 nm formed between the top DBR and the bottom DBR, and a semiconductor step or ring surface relief structure having a depth of 20-50 nm and a diameter of 2-6 um formed on at least one top most layers of the top DBR. The at least one quantum well comprises InGaAs with an In composition of 0.04-0.12, the at least one quantum well barrier comprises AlxGaAs where x is between 0.3-0.4 or GaAsPy where y is between 0.2-0.3, and the at least one quantum well is adjusted for a photoluminescence emission target between 835-840 nm. The top most layer may be p-doped, and is terminated (1) either in-phase or anti-phase in relation to a standing wave corresponding the VCSEL, and/or (2) in a layer having a fixed thickness in between the anti-phase and in-phase condition of the standing wave.

According to an example embodiment, a VCSEL comprises a top DBR and a bottom DBR each made with multiple layers of semiconductor thin films, an active region having at least one quantum well and at least one quantum well barrier each having a thickness of 3-10 nm formed between the top DBR and the bottom DBR, and a dielectric step or ring surface relief structure having a depth of 20-150 nm and a diameter of 2-6 um formed on at least one top-most layer of the top DBR. The at least one quantum well comprises InGaAs with an In proportion of 0.04-0.12, the at least one quantum well barrier comprises AlxGaAs where x is between 0.3-0.4 or GaAsPy where y is between 0.2-0.3, and the at least one quantum well is adjusted for a photoluminescence emission target between 835-840 nm. The topmost layer may be p-doped. The surface relief structure is formed by wet chemical etching of dielectric layers fabricated on the at least one top-most layer, and the top-most dielectric layer is terminated (1) either in-phase or anti-phase in relation to a standing wave corresponding the VCSEL, and/or (2) in a layer having a fixed thickness in between the anti-phase and in-phase condition of the standing wave.

Some example embodiments include the above VCSELs wherein the emission wavelength is in the wavelength range of 850-860 nm. The VCSELs may include both anode and cathode electrical contacts arranged as top-top configuration. The VCSEL may be grown on p-doped or n-doped or un-doped (semi-insulating) GaAs substrate.

The VCSELs may further comprise at least one AlxGa1-xAs oxidation layer with Al content of at least 98 percent, and when multiple oxide layers are available, forming at least one oxide layer placed above and below optical cavity/gain region of the VCSEL. The VCSEL may further comprise mesa passivation with low dielectric constant materials such as one or more of SiN and BCB.

Some example embodiments include VCSEL in which the surface relief structure is formed on the top-most layer and one or more layers consecutively below the top-most layer, wherein the layers in which the surface relief is formed includes one or more of P++GaAs contact, AlGaAs GIRN, or Al0.12GaAs layers.

Some example embodiments include VCSEL in which the dry etching includes inductively coupled plasma reactive ion etching (ICP-RIE).

Some example embodiments include VCSEL in which the dielectric layer comprises SiN.

Another example embodiment provides a method of manufacturing a VCSEL. The method comprises: forming a top distributed Bragg reflector (DBR), a bottom DBR and an active region, wherein the top and bottom DBRs each being with multiple layers of semiconductor thin films, and wherein the active region having at least one quantum well and at least one quantum well barrier each having a thickness of 3-10 nm formed between the top DBR and the bottom DBR; and forming a surface relief structure formed on at least the top-most layer of the top DBR by dry or wet etching of semiconductor or dielectric thin films, wherein the surface relief structure has a depth of 20-150 nm and a diameter of 2-6 um, and the top surface of the top-most layer is terminated (1) either in-phase or anti-phase in relation to a standing wave corresponding the VCSEL, and/or (2) in a layer having a fixed thickness in between the anti-phase and in-phase condition of the standing wave. The at least one quantum well comprises InGaAs with an In proportion of 0.04-0.12, the at least one quantum well barrier comprises AlxGaAs where x is between 0.3-0.4 or GaAsPy where y is between 0.2-0.3, wherein the at least one quantum well is adjusted for a photoluminescence emission target between 835-840 nm.

Another example embodiment provides a method of manufacturing a VCSEL. The method comprises: forming a top distributed Bragg reflector (DBR), a bottom DBR and an active region, wherein the top and bottom DBRs each being with multiple layers of semiconductor thin films, and wherein the active region having at least one quantum well and at least one quantum well barrier each having a thickness of 3-10 nm formed between the top DBR and the bottom DBR; and forming a semiconductor step or ring surface relief structure having a depth of 20-50 nm and a diameter of 2-6 um formed on at least one top most layers of the top DBR, the top most layer being p-doped, and wherein the top-most layer is terminated (1) either in-phase or anti-phase in relation to a standing wave corresponding the VCSEL, and/or (2) in a layer having a fixed thickness in between the anti-phase and in-phase condition of the standing wave. The at least one quantum well comprises InGaAs with an In proportion of 0.04-0.12, the at least one quantum well barrier comprises AlxGaAs where x is between 0.3-0.4 or GaAsPy where y is between 0.2-0.3, wherein the at least one quantum well is adjusted for a photoluminescence emission target between 835-840 nm.

Another example embodiment provides a method of manufacturing a VCSEL. The method comprises: forming a top distributed Bragg reflector (DBR), a bottom DBR and an active region, wherein the top and bottom DBRs each being with multiple layers of semiconductor thin films, and wherein the active region having at least one quantum well and at least one quantum well barrier each having a thickness of 3-10 nm formed between the top DBR and the bottom DBR; and forming a dielectric step or ring surface relief structure having a depth of 20-150 nm and a diameter of 2-6 um on at least one top-most layer of the top DBR, the top-most layer being p-doped, wherein the surface relief structure is formed by wet chemical etching of dielectric layers fabricated on the at least one top-most layer, and wherein the top-most dielectric layer is terminated (1) either in-phase or anti-phase in relation to a standing wave corresponding the VCSEL, and/or (2) in a layer having a fixed thickness in between the anti-phase and in-phase condition of the standing wave. The at least one quantum well comprises InGaAs with an In composition of 0.04-0.12, the at least one quantum well barrier comprises AlxGaAs where x is between 0.3-0.4 or GaAsPy where y is between 0.2-0.3, wherein the at least one quantum well is adjusted for a photoluminescence emission target between 835-840 nm.

These aspects, features, and example embodiments may be used separately and/or applied in various combinations to achieve yet further embodiments of this invention.

BRIEF DESCRIPTION OF THE DRAWINGS

These and other features and advantages may be better and more completely understood by reference to the following detailed description of exemplary illustrative embodiments in conjunction with the drawings, of which:

FIG. 8 illustrates conditions or parameters for a dry etching process, according to certain example embodiments;

FIG. 14 illustrates selected static characteristics of wafer level selective probing according to certain example embodiments;

FIGS. 16A and 16B illustrate phase conditions for semiconductor surface relief step structures according to certain example embodiments;

FIGS. 17A and 17B illustrate phase conditions for dielectric surface relief ring structures, according to certain example embodiments;

FIGS. 18A-B illustrate aspects of surface relief design and mode control, according to certain example embodiments;

FIG. 21 illustrates a table of example allowable etch depth margins for selected Surface Relief Phase conditions.

DETAILED DESCRIPTION OF CERTAIN EXAMPLE EMBODIMENTS

Figure 1:
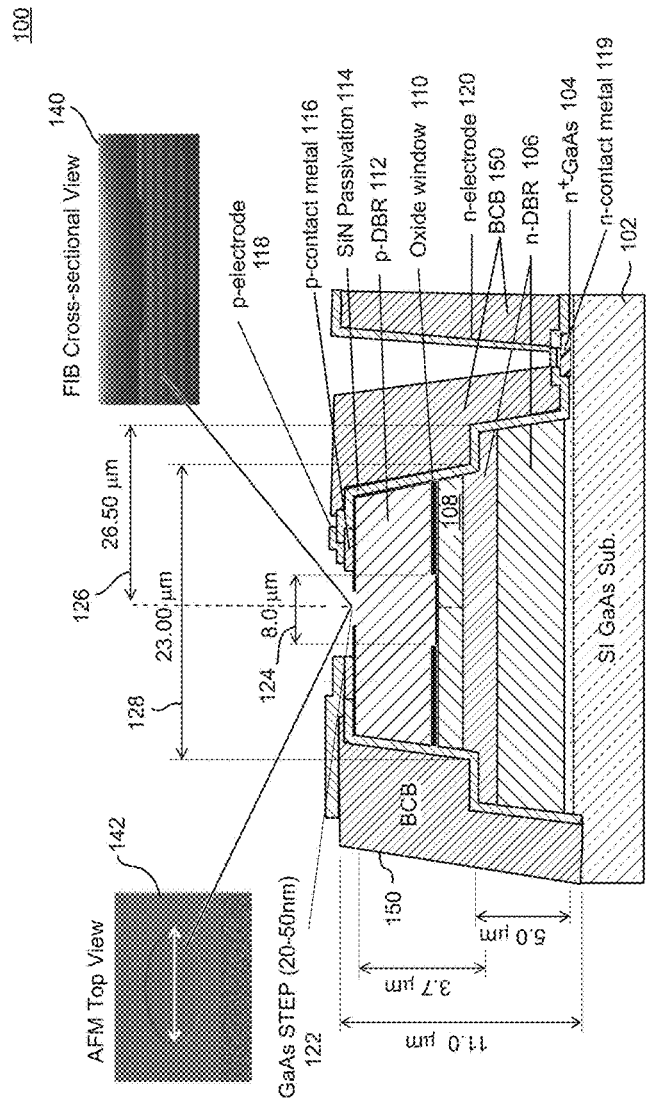
FIG. 1 is a schematic cross-sectional view of the structure of a semiconductor light-emitting element with semiconductor step surface relief according to certain example embodiments.

Certain example embodiments described herein relate to surface-emitting semiconductor laser elements (e.g., VCSELs) and the like, and methods for manufacturing such elements. More particularly, certain example embodiments provide VCSELs that include tunable optical phase filters that substantially improve data transmission capabilities of the VCSEL.

According to certain example embodiments, an optical phase element that controls photon lifetime and relaxation oscillation damping behavior and filters transverse optical modes for achieving an optimal dynamic performance of a laser is provided. Semiconductor lasers, such as, for example, VCSELs at 850 nm emission wavelength, integrated with tunable optical phase filters as reliable optical transmitters have high potential in applications such as, for example, high-speed data communication for short reach applications.

A known technique for improving VCSELs uses a shallow surface relief etched in the top DBR. The modal properties of a VCSEL with a top DBR having a sufficiently low level of reflectivity is highly sensitive to surface modifications. By removing some of the top layers (of about λ/4, where λ is the applicable wavelength) from the top DBR, an anti-phase reflection is obtained from the top of the semiconductor, which results in a relatively large loss in the VCSEL cavity causing, among other things, a reduction in the transverse optical modes. Erik Haglund et al., "Reducing the spectral width of high speed oxide confined VCSELs using an integrated mode filter", Proc. of SPIE Vol. 8276, pp. 8276L-1-L-8, (Haglund1) the contents of which is hereby incorporated by reference in its entirety, describes aspects of a known VCSEL integrating a surface relief etched on the top DBR.

According to an example embodiment, an 850 nm VCSEL transmitter includes an active region that has one or more quantum wells having InGaAs material; and two or more quantum well barriers having AlGaAs or GaAsP materials adjacent to the one or more quantum wells. A surface relief structure is made either (i) on the topmost GaAs surface/contact layers by either dry or wet etching or (ii) with the help of plasma enhanced chemical vapor disposition (PE-CVD) made thin SiN layer made on a GaAs layer with wet etching for tunable static and dynamic characteristics such as output power, slope efficiency, and resonance oscillation bandwidth, photon lifetime through its damping, rise/fall times of eye-opening, over shooting, and jitter.

In contrast to conventionally known VCSELs, certain example embodiments provide for, among other things, one or more of forming a VCSEL from 4-inch full wafer-level probing, a VCSEL with only a single oxide layer, a VCSEL that accommodates quantum wells of different types such as GaAs and InGaAs, a VCSEL that accommodates quantum well barriers of different types such as AlGaAs and GaAsP, and moreover, a VCSEL that provides for etching down to P$^+$GaAs layer and P$^+$AlGaAs layer, wider surface relief diameters from 1 to 7 um, and the ability to include etching of semiconductor layers and/or dielectric film. The shallow surface relief causes suppression of higher order transverse modes, by changing spatial characteristics such as diameter and depth, operate as a tunable phase filter. Features of certain example embodiments, such as those noted above, enable more efficient and flexible use of example embodiments in high speed data applications, such as, for example, short-reach high speed data applications.

By implementing (e.g., integrating) surface relief structures on the VCSEL as in certain example embodiments, various advantages are achieved over conventional techniques of improving VCSEL performance. The advantages may include improved output power and slope efficiency control, spectral line width control through mode discrimination (e.g., for long distance transmission), damping control by flat bandwidth, rise time control, over shooting control in eye-diagrams, superior thermal properties such as reduced device (junction) temperatures and reduced thermal impedance and overall stable device performance of VCSEL at higher speeds. Haglund et al, "Impact of Damping on High-Speed Large Scale VCSEL Dynamics," Journal of Lightwave Technology, Vol. 33, No. 4, February 2015 (Haglund2), the contents of which is hereby incorporated by reference in its entirety, describes related aspects.

FIG. 1 is a schematic cross-sectional view of the structure 100 of a semiconductor light-emitting element with semiconductor step surface relief according to certain example embodiments. The structure 100 comprises a VCSEL integrated with a step surface relief structure.

The VCSEL structure 100 includes a GasAs substrate 102, n$^+$-GaAs layer 104, n-DBR multilayer stack 106, an active layer cavity 108, oxide window 110, p-DBR multilayer stack 112, SiN mesa passivation layer 114, p-contact metal 116, p-electrodes 118, n-contact metal 119 and an n-electrode 120. The p-electrode 118 and n-electrode-120 will be formed in a single coating using vacuum evaporation or sputtering. Benzocyclobutene (BCB) or like low dielectric polymers 150 may be used surrounding the VCSEL mesa structure (e.g., to obtain the desired shape of structure 100). The mesa passivation layer may comprise low dielectric (∈) materials, (preferably ∈<3.0).

The VCSEL structure 100 also has integrated with it a GaAs step surface relief structure 122. The step surface relief structure may have a depth in the range of 20-50 nanometers (nm). Inset 142 provides a top view, captured using atomic force microscopy (AFM), of the circular-shaped opening provided in the GaAs step surface relief structure 122. Inset 140 provides a cross-sectional view of the same GaAs step surface relief structure 122, captured using focused ion beam etching (FIB).

The diameter of top-mesa 128 kept at or substantially at 23.0 um such that the distance from one near-end of the p-DBR horizontal portion to the other near-end across the center of the VCSEL is at or about 23.00 micrometers. The radius of bottom mesa 126 is kept at or substantially at 26.5 um such that the distance from the center of the VCSEL to the far-end of the n-DBR horizontal portion is a distance of or about 26.5 micrometers. The top (128) and the bottom (126) mesa dimensions chosen such that the mesa capacitance is optimum for top mesa and sufficient space is formed to coat low dielectric (150) coverage surrounding both mesas. In the example embodiment shown, an un-oxidized area 124 in the oxide window 110 forms an oxide aperture for current injection. The oxide aperture 110 may be sized (e.g., diameter) at or about 8.0 micrometers.

Figure 2:
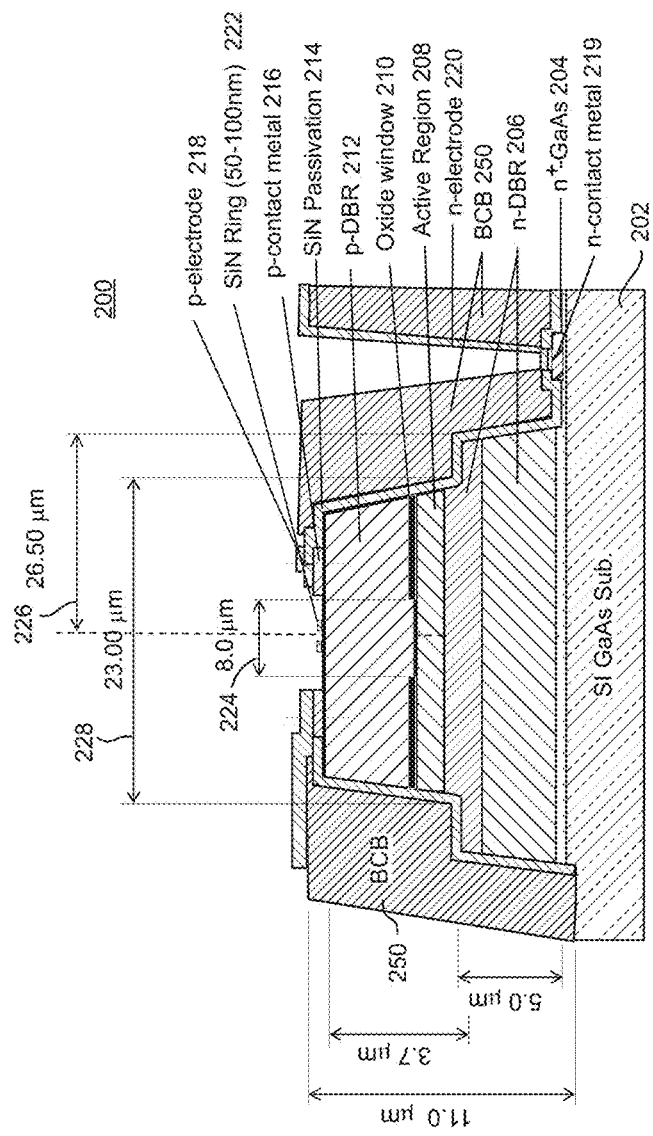
FIG. 2 is a schematic cross-sectional view of the structure of a semiconductor light-emitting element with dielectric ring surface relief according to certain example embodiments.

FIG. 2 is a schematic cross-sectional view of the structure 200 of a semiconductor light-emitting element with an integrated dielectric ring surface relief according to certain example embodiments. The VCSEL structure 200 includes a GaAs substrate 202, n+-GaAs layer 204, n-DBR multilayer stack 206, an active layer cavity 208, oxide window 210, p-DBR multilayer stack 212, SiN mesa passivation layer 214, p-contact metal 216 and p-electrode 218, n-contact metal-219 and an n-electrode 220, arranged as shown in FIG. 2. BCB or like low dielectric polymers 250 may be used surrounding the VCSEL mesa structure (e.g., to obtain the desired shape of structure 200).

Moreover, the VCSEL structure 200 has integrated with it a SiN ring surface relief structure 222 with a thickness range of 50-150 nm.

In the example embodiment shown, an un-oxidized area 224 in the oxide window 210 forms an oxide aperture. The oxide aperture 210 is sized (e.g., diameter) at or about 8.0 micrometers. The diameter of top-mesa 228 kept at or substantially at 23.0 um such that the distance from one near-end of the p-DBR horizontal portion to the other near-end across the center of the VCSEL is at or about 23.00 micrometers. The radius of bottom mesa 226 kept at or substantially at 26.5 um such that the distance from the center of the VCSEL to the far-end of the n-DBR horizontal portion is a distance of or about 26.5 micrometers. The top (228) and the bottom (226) mesa dimensions are chosen such that the mesa capacitance is optimum for top mesa, and sufficient space is formed to coat low dielectric (250) coverage surrounding both mesas.

In certain example embodiments, the semiconductor thin films and layers described herein that are used in, for example, forming the VCSEL structures of FIGS. 1 and 2, are sequentially formed by epitaxial crystal growth in the order from bottom to top, as, for example, illustrated in FIGS. 1 and 2. Technique such as, but not limited to, Metal Organic Chemical Vapor Deposition (MOCVD) and or Molecular Beam Epitaxy (MBE) may be used in forming VCSEL structure 100. The dimensions of various sections/layers of the epitaxial structure for the semiconductor elements 100 and 200 and/or the composition thereof may be determined so that aspects such as phase relationships between various layers satisfy predetermined criteria.

The active region cavities 108 and 208 may each include a light emitting quantum well and barrier layers (not separately shown) sandwiched between layers of SCH/Grin SCH (not separately shown). The light emitting layer includes one or more quantum wells and barriers. In certain example embodiments, the one or more quantum wells may comprise Gallium Arsenide (GaAs) or Indium Gallium Arsenide (InGaAs), and the one or more barrier layers may comprise Gallium Arsenide (GaAs) or Aluminum Gallium Arsenide (AlGaAs), or Gallium Arsenide Phosphide (GaAsP) to create electrical and optical confinement of injected carriers and emitted photons. The InGaAs in quantum wells may have an In proportion of 0.04-0.12. Quantum well barriers may have $Al_xGaAs$ where x is between 0.3-0.4 or $GaAsP_y$ where y is between 0.2-0.3. The quantum wells may be adjusted for a photoluminescence emission target between 835-840 nm. The light emitting layer is configured to generate light having a predetermined wavelength. In certain example embodiments, a predetermined emission wavelength may be a wavelength between 850-860 nm. When a current is applied to the element 100, for example in FIG. 1, which then flows through the active region cavity 108, photons are generated by electron-hole recombination in the quantum wells of the light emitting layer. The generated light is amplified by being reflected back and forth between the top and bottom DBRs 112 and 106, and subsequently a portion of the amplified light is emitted (e.g., vertically emitted) through the top DBR 112 and out of a contact window (not shown) and/or surface relief step/ring structures 122/222 at the top of element 100/200. Except for the oxide window 110/210, the p-DBR multilayer stack would be formed with AlxGa1−xAs (x=0.9-0.12) with a reflectivity approximately (99.97%), slightly lower than the n-DBR multilayer stack (99.99%). On the top of the p-DBR a p-contact window comprising a p+ GaAs, p+ AlGaAs and p+ AlGaAs GRIN layers formed either in-phase or anti-phase conditions of emitted light. By using etch depth of the step/ring surface relief structures in p-contact window, the phase of the emitted light can be tuned from in-phase to anti-phase or vice-versa. According to certain example embodiments, the active region 108 and or 208 includes (or more specifically, the light emitting layer in the active region includes) three InGaAs quantum wells or five InGaAs quantum wells where x differs based upon the emission wavelength. For lower speeds up to 10 Gb/s and 850 nm emission, 3 InGaAs quantum wells (x=0) can give sufficient optical gain, and for higher speeds up to or larger than 25 Gb/s and 850 nm emission sometimes 5 InGaAs quantum wells (x=0.04-0.12) may be more appropriate in order to achieve sufficient optical gain.

The oxide layers 110/210 comprises at least one oxide layer (also sometimes referred to as a current limiting layer) formed from AlxGa1−xAs (x=0.98-1.0). The oxide layer is configured such that an aperture of circular or substantially circular shape is created in the center region of the oxide layer. The oxide layer 110 functions to direct the electrical current generally toward the center of the light emitting layer in the active region.

In the embodiment being described, the substrate 102 comprises n-doped GaAs. However, it will be appreciated that the present invention is not limited thereto, and may in certain example embodiments include p-doped or n-doped or un-doped (semi-insulating) GaAs substrates.

In certain example embodiments, including those shown in FIGS. 1 and 2, the etch depth for the surface relief structures, or the portion of the etch depth in the top DBR, can be used to control photon lifetime through mirror loss. Reduced photon lifetime leads to higher speed through bandwidth and damping control.

The relaxation oscillation frequency ($f_{ro}$) may be based upon photon life time ($\tau p$) and mirror loss ($\alpha m$) through the following relationships:

$$f_{ro} \propto \sqrt{\frac{1}{\tau_p}} \quad (1)$$

Photon lifetime can be specified as:

$$\tau_p = \frac{1}{\alpha_i + \alpha_m^T + \alpha_m^B} \quad (2)$$

and mirror loss in p-DBR be expressed as $$\alpha m = \left(\frac{1}{2d}\right) \ln \frac{1}{R}, \quad (3)$$

R being the reflectivity of DBR and d being the resonator length that includes etch depth. In travelling a round trip through the resonator (e.g., both DBRs and active region cavity) of length d, the photon flux is reduced by a factor RtRb exp(−2αd). This reduction of photon flux is called a total mirror loss 'α'. Any etch depth from in-phase to anti-phase thickness of top most p++ GaAs layer to photon flux density (mirror) loss in p-DBR and affects the life time of photons.

Relationship (1) can be expressed as:

$$f_{ro} = \frac{1}{2\pi} \sqrt{\left[\frac{\Gamma S v_g \frac{\partial g}{\partial n}}{\tau_p} \frac{1}{\chi}(I - I_{th})\right]} \quad (4)$$

And, further $$\gamma = 4\pi^2 \left(\tau_p + \frac{\varepsilon \cdot \chi}{v_g \left(\frac{\partial g}{\partial n}\right)}\right) \cdot f_{ro}^2 + \gamma_o. \quad (5)$$

In (1)-(5) above, $f_{ro}$ is the resonance frequency of the system, $\alpha_m^B$ is the mirror transmission loss rate through the bottom DBR, $\alpha_m^T$ is the mirror transmission loss rate through the top DBR, $\gamma$ is the damping factor, $\gamma_o$ is the damping factor offset, photon lifetime is represented by $\tau_p$, $\in$ represents the gain compression factor, $\chi$ represents the transport factor, $v_g$ represents the photon group velocity, $$\frac{\partial g}{\partial n}$$

represents the differential gain, $\Gamma$ is the optical confinement factor, I is the bias/modulation current, Ith is the threshold current, and S is the photon density, See Petter Westbergh et al. "Impact of Photon Lifetime on High Speed VCSEL Performance," IEEE Journal of Selected Topics in Quantum Electronics, Vol. 17, No. 6, November/December 2011, the contents of which is hereby incorporated by reference in its entirety.

Figure 3:
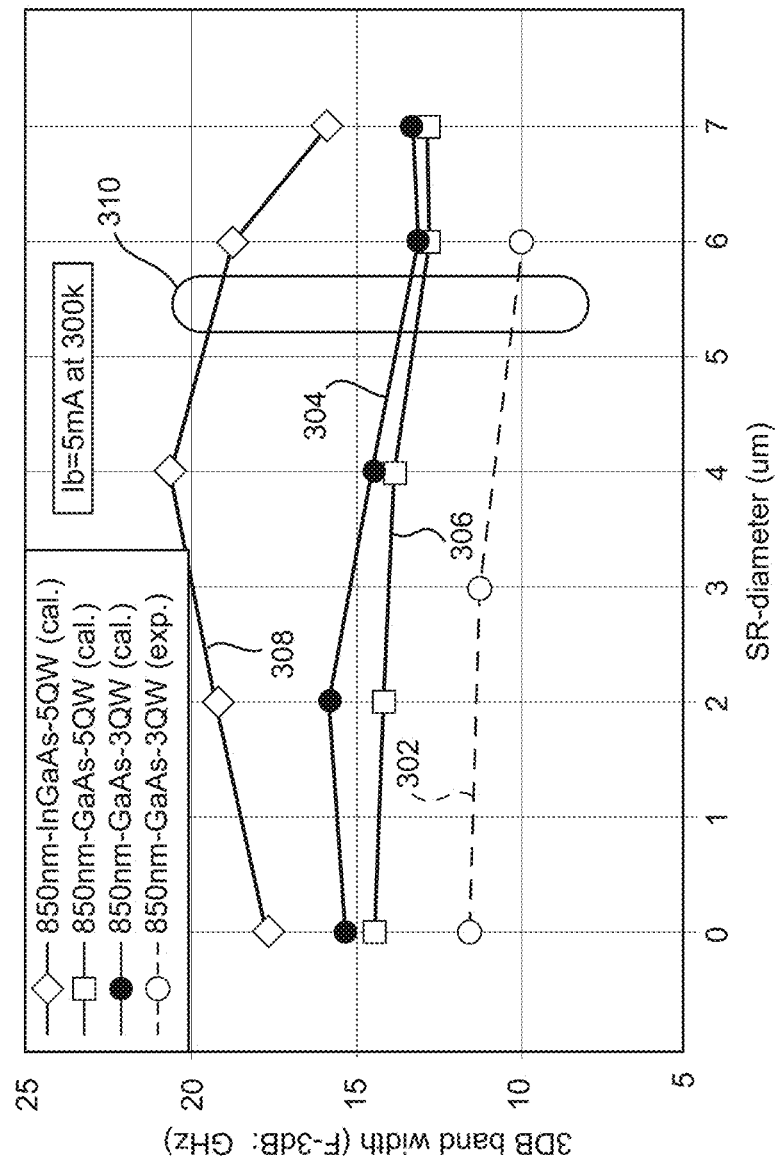
FIGS. 3 and 4 illustrate the effect of surface relief etch depth through surface relief diameter on the bandwidth and the damping factor, according to certain example embodiments.
Figure 4:
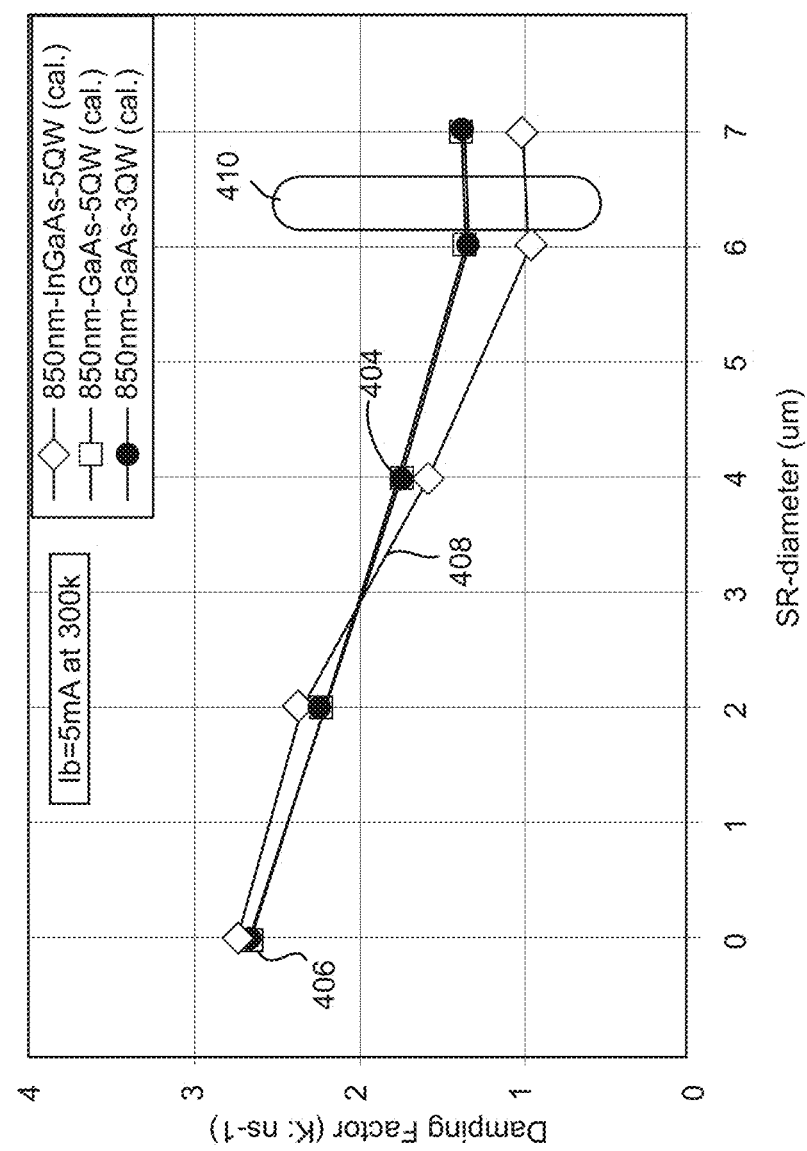

The effects of SR etch depth through SR diameter on the bandwidth and the damping factors are illustrated in FIGS. 3 and 4. FIG. 3 illustrates how 3 dB bandwidth ($f_{-3dB}$ shown in the y-axis in GHz) changes according to the diameter of the surface relief (SR-diameter shown in the x-axis). FIG. 3 illustrates the behavior of an experimentally determined 850 nm emission with 3 GaAs quantum wells 302, a calculated 850 nm emission with 3 GaAs quantum wells 304, a calculated 850 nm emission with 5 GaAs quantum wells 306, and a calculated 850 nm emission with 5 InGaAs quantum wells 308. The 2, 4, 6, and 7 um SR diameters correspond to SR depths of 25, 40, 55, 60 nm, respectively. Accordingly, the maximum 3 dB bandwidth occurs at a particular depth (40 nm), which is a characteristic feature of surface relief structure. The 40 nm etch depth corresponds to an SR diameter of 4 um.

Figure 7:
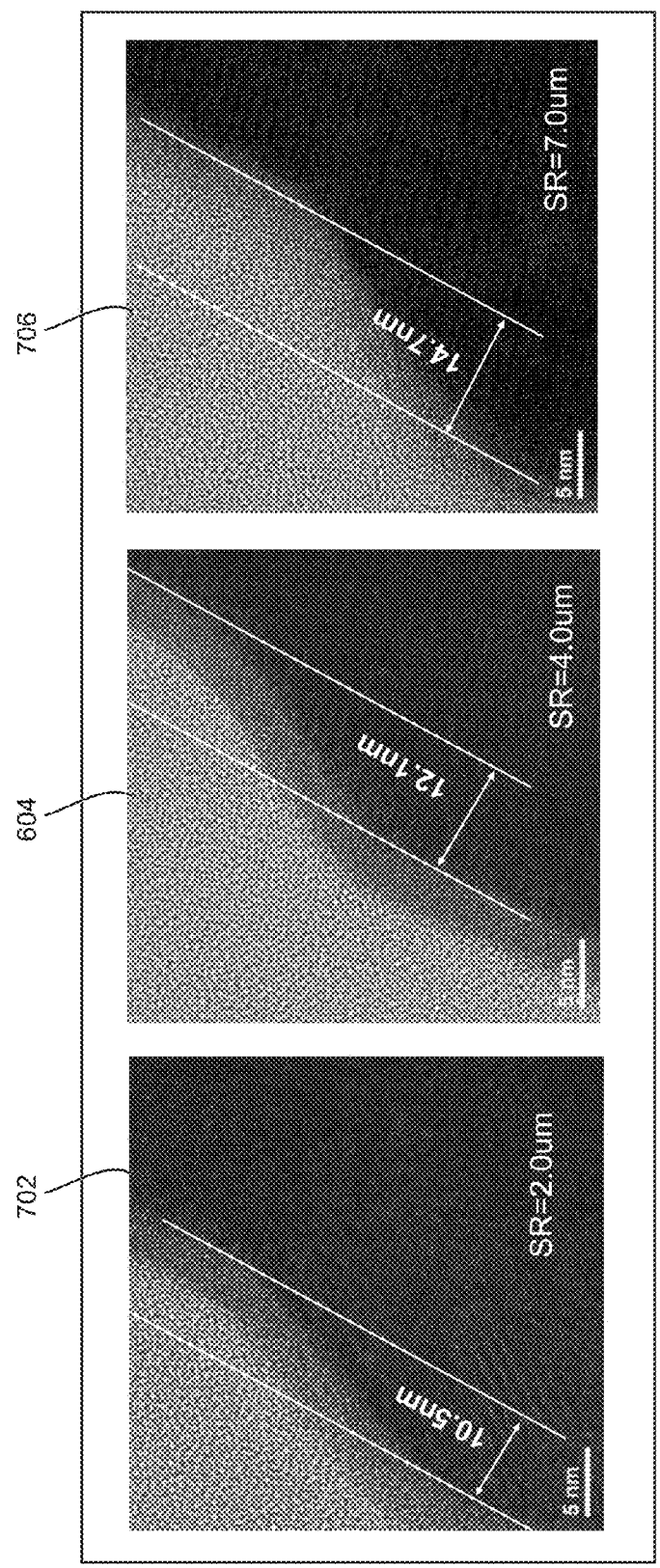
FIG. 7 illustrates surface relief etch depth control using surface relief diameter, according to certain example embodiments.

The relationship between the SR diameter and etch depth, in some example embodiments, in relation to FIG. 3 may be determined and/or configured by, for example, transmission electron microscope (TEM) investigations. FIG. 7 represents one such example study indicating depth variation for a given SR diameter. TEM is an imaging technique. The actual etch depth may be made by dry (RIE-reactive ion etching) or wet (chemical) etching. The etch depth depends on dry or wet etch process conditions. Example etch rates are shown in FIG. 8. In certain example embodiments, by changing etch depth, photon lifetime may be changed in order to achieve a maximum bandwidth.

FIG. 4 illustrates how the damping factor (K shown in the y-axis in $ns^{-1}$) changes according to the diameter (depth) of the surface relief (SR-diameter shown in the x-axis). FIG. 4 illustrates the behavior of a calculated 850 nm emission with 3 GaAs quantum wells 404, a calculated 850 nm emission with 5 GaAs quantum wells 406, and a calculated 850 nm emission with 5 InGaAs quantum wells 408. The 2, 4, 6, and 7 um SR diameters correspond to SR depths of 25, 40, 55, 60 nm, respectively.

FIG. 3 illustrates, in 310, that the bandwidth can be increased by decreasing the photon lifetime. In effect, the surface relief is configured such that when transverse modes are transmitting in the area of the surface relief structure, reflectivity of the modes change, the photo lifetime is reduced, and the output bandwidth is increased. FIG. 4 illustrates the damping factor can be decreased, as shown in 410, by decreasing the photon lifetime. As damping factor (K) and relaxation oscillation frequency ($f_{ro}$) are interrelated through relations 3 & 4 above, surface relief etch depth increases bandwidth and reduces damping resulting high-speed operation of VCSELs.

As shown in FIGS. 3 and 4, InGaAs quantum wells, in comparison to GaAs quantum wells, at 850 nm emission have high potential for high speed VCSELs. VCSELs with InGaAs quantum wells also show a larger reduction of damping factor when compared to VCSELs with GaAs quantum wells. Moreover, bandwidth and damping are well controlled through etch depth for optimum VCSEL performance.

Figure 6:
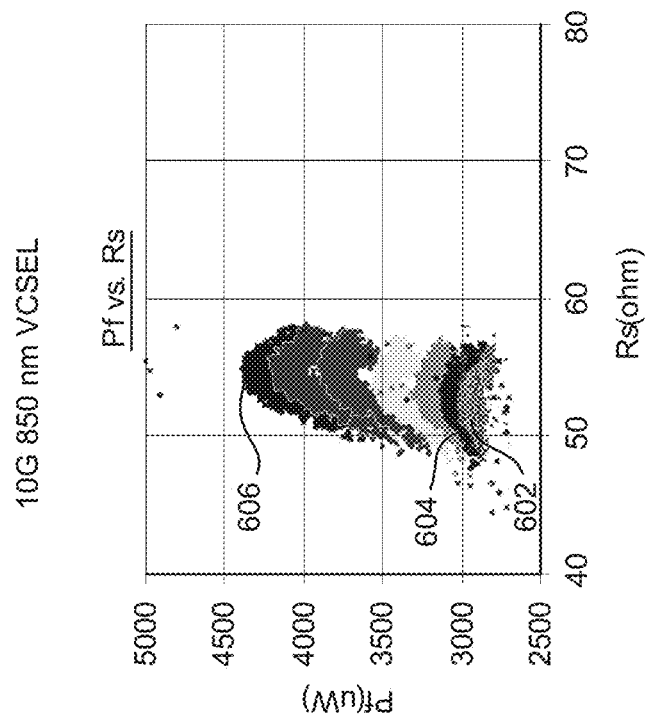
FIGS. 5 and 6 illustrate the behavior of output power (Pf) vs. resistance, for example semiconductor step surface relief embodiments
Figure 5:
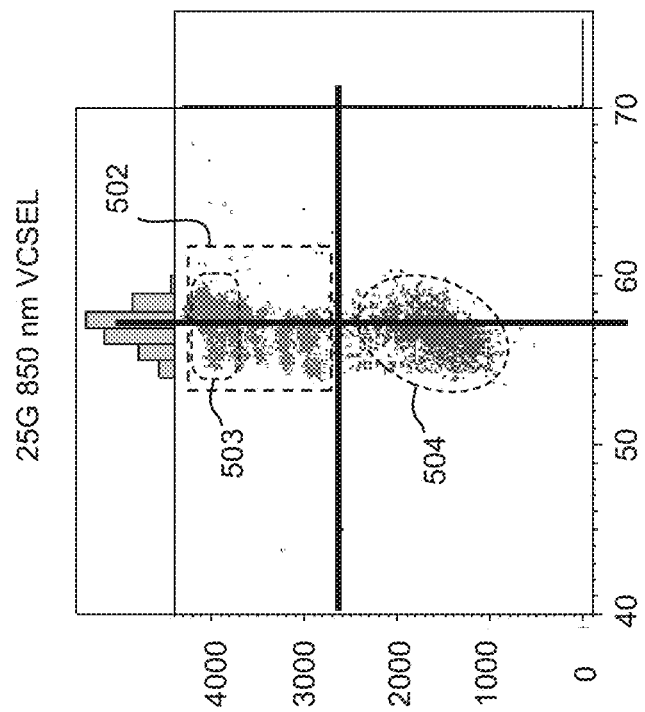

FIGS. 5 and 6 illustrate the behavior of output power (Pf) vs. resistance for example semiconductor step surface relief embodiments. FIG. 5, which illustrates Pf in relation to the resistance for a 25 G 850 nm VCSEL, shows the area 502 of primary SR impact when InGaAs quantum wells are used.

The data points with Pf>4000 uW 503 within 502 are for a surface relief diameters of 7.0 um with largest etch depth are higher than those without surface relief with data points of Pf<2000 mW 504 out-side 502. Thus, for larger surface relief diameters and with largest etch depth, a higher output power is obtained for VCSELs with InGaAs. FIG. 6 illustrates Pf in relation to the resistance for a 10 G 850 nm VCSEL with GaAs quantum wells. FIG. 6 illustrates that output power Pf increases with increasing diameter. For example, Pf corresponding to embodiments with no surface relief is shown in area 602, Pf with 1 um shown in area 604 (which largely overlaps area 602), and area 606 includes Pf corresponding to a surface relief diameter of 7 um. The surface relief diameter dependence of increased Pf, as shown in FIGS. 5 and 6, indicates the step surface relief etch depth variation across wafer.

FIG. 7 illustrates surface relief etch depth control using surface relief diameter, according to certain example embodiments. Images 702, 704 and 706, respectively, illustrate transmission electronic microscopic (TEM) images for the increasing etch depths of 10.5 nm, 12.1 nm, and 14.7 nm achieved for surface relief diameters of 2.0 um, 4.0 um, and 7.0 um. Thus, as shown in FIG. 7, the etch depth can be controlled by changing surface relief diameters.

FIG. 8 illustrates conditions or parameters for a dry etching process, according to certain example embodiments. Specifically, table 800 shows conditions 1-4, each specifying several parameters, for performing a dry etching process for achieving the VCSEL integrated with surface relief as described above. Reactive Ion Etching (RIE) etch conditions are adjusted to have lower GaAs etch rate for controlled etch depth and process stability when etching layers including GaAs. The optimum etch rate is determined to be 20-25 nm/min, that allows larger etching time for precise control of etch thickness of p++ GaAs layer. The optimum etch rate can be determined as a lowest etch rate conditions to control process stability and repeatability.

Figure 9:
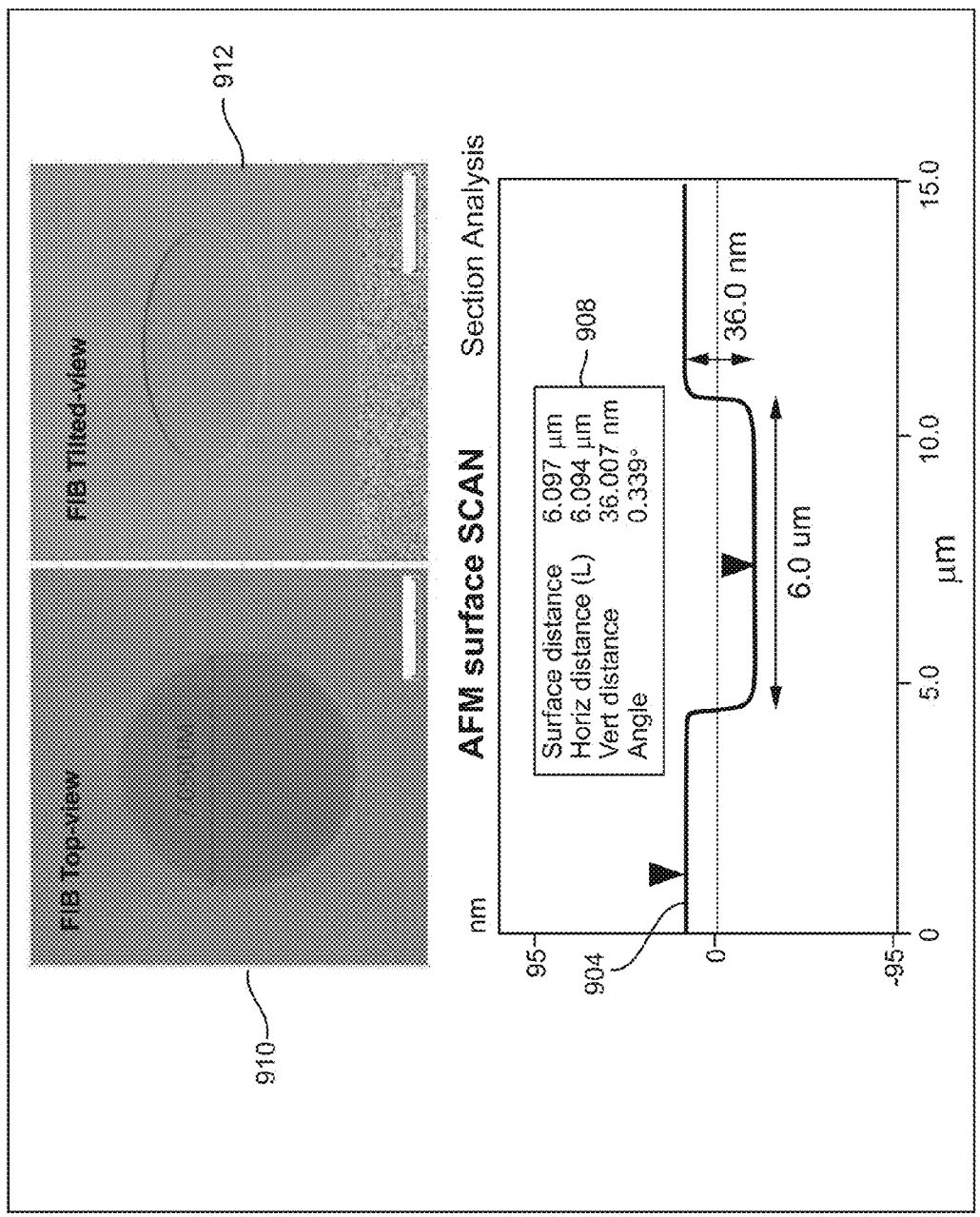
FIG. 9 illustrates selected aspects of surface relief metrology for forming the step surface relief used, for example, in the VCSEL of FIG. 1, according to certain example embodiments.

FIG. 9 illustrates selected aspects of surface relief metrology for forming the step surface relief used, for example, in the VCSEL of FIG. 1. Screen 902 illustrates the configuration of the etching process for achieving the step surface relief of depth 36 nm. The AFM surface scan cross-section schematic 904 and parameters 908 are seen on a screen. The FIB top view 910 illustrates a view from over the VCSEL, when the step surface relief is seen as a circular area of 7.050 um. FIB tilted view 912 illustrates the same step surface relief when viewed at a slight angle—yielding an elongated oval shape to the area.

Figure 10:
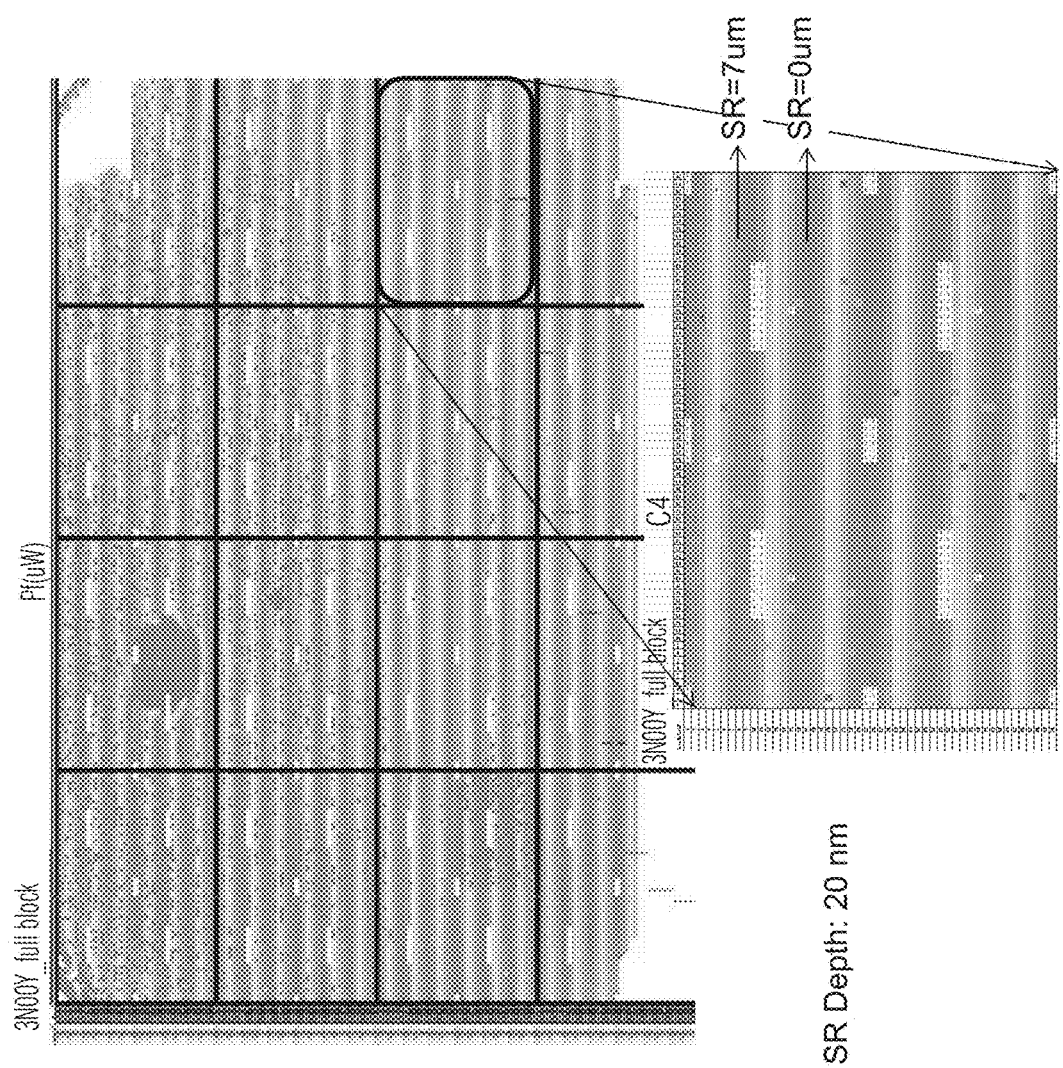
FIG. 10 illustrates surface relief on 4-inch wafer level with full wafer probing, according to certain example embodiments.

FIG. 10 illustrates effects of surface relief on a 4-inch wafer level with full wafer probing of first wafer, according to certain example embodiments. As noted above, certain example embodiments can advantageously utilize this type of 4-inch full wafer probing, thereby yielding efficiencies over other techniques of surface relief. The surface relief depth was kept at 20 nm. Areas corresponding to surface relief diameters 0 um and 7 um are also shown in FIG. 10. SR=0 um corresponds to conventional VCSELs without SR. The periodic color contrast that is clearly visible in the inset of the FIG. 10 indicates that the SR depth was uniformly maintained across 4-inch wafer using dry etching of GaAs semiconductor. The wafer probing of VCSEL chips with SR (1-7 um) and without SR (0 um=conventional) VCSELs, was simultaneously done on the same wafer.

Figure 12:
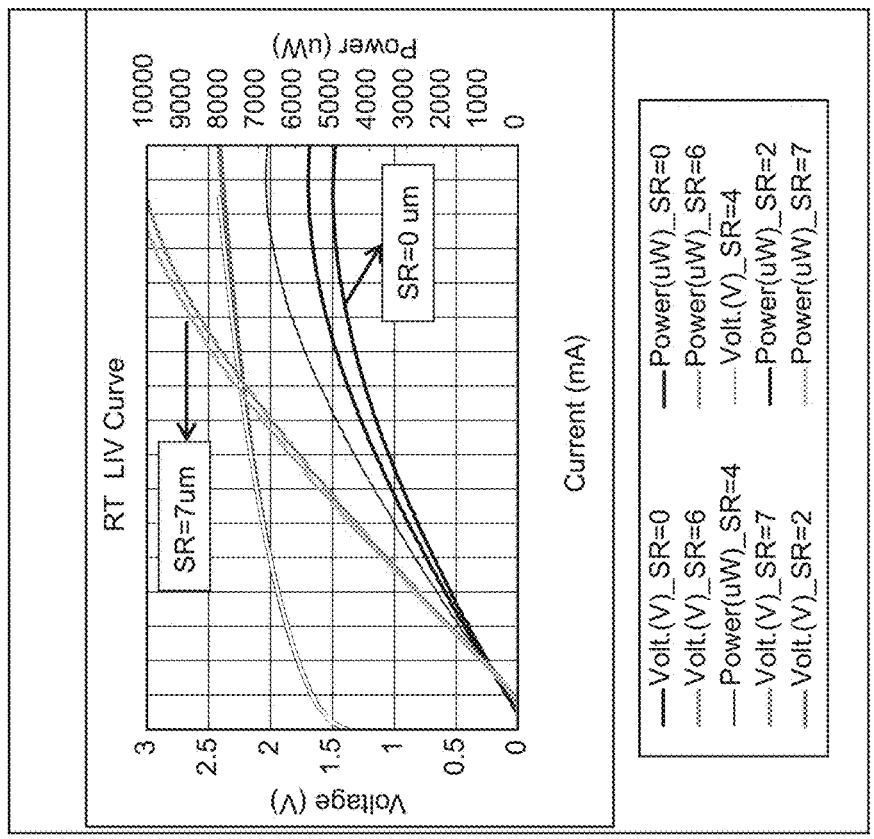
FIGS. 11 and 12 illustrate aspects of selective probing when used on surface relief technology on 4-inch wafer level, according to certain example embodiments.
Figure 11:
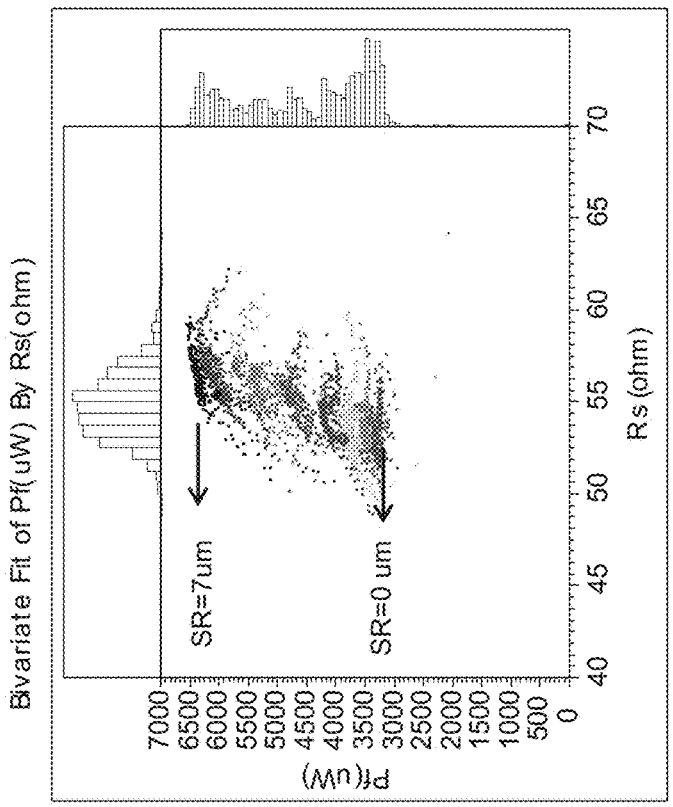

FIGS. 11 and 12 illustrate aspects of selective probing when used on surface relief technology on 4-inch wafer level for second wafer, according to certain example embodiments. FIG. 11 shows the relationship between Pf and resistance when the surface relief diameter is changed from 0 um (no surface relief) to 7 um. FIG. 12 is a room temperature light current voltage (RT LIV) curve showing the relationship between voltage, current and power observed as the surface relief diameter changes from 0 to 7 um across the wafer. The surface relief depth is fixed at 36 nm. FIGS. 11 and 12 both illustrate the increase in output power corresponding to larger surface relief diameter of 7 um.

Figure 13:
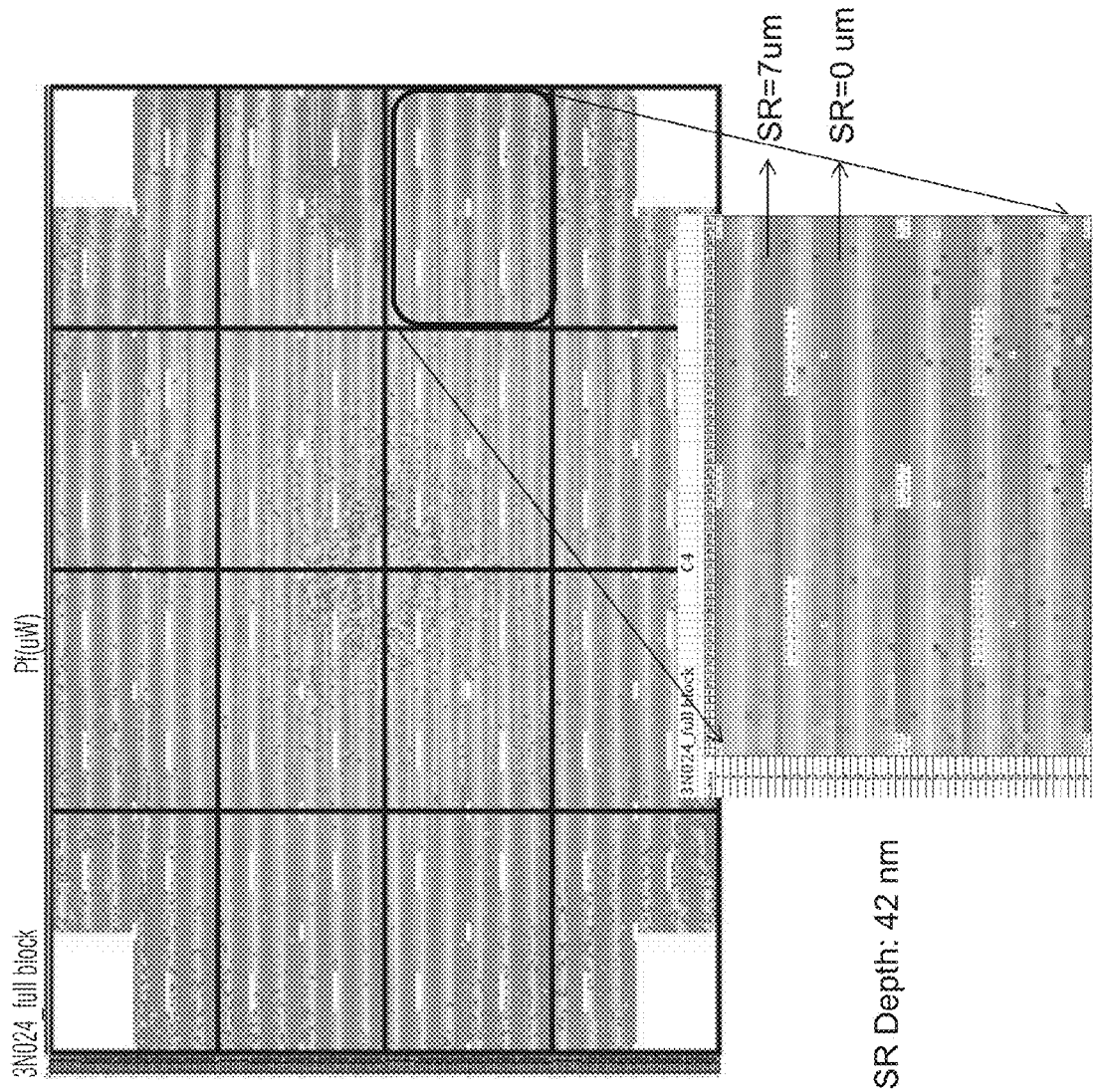
FIG. 13 illustrates surface relief on 4-inch wafer level with full wafer probing, according to certain example embodiments.

FIG. 13 illustrates surface relief on 4-inch wafer level with full wafer probing, of third wafer according to certain example embodiments. Areas corresponding to diameters 0 um and 7 um are shown in FIG. 10. The surface relief depth is set at 42 nm. The periodic color contrast in the inset of FIG. 13 clearly shows that the SR depth was uniformly maintained across 4-inch wafer using dry etching of GaAs semiconductor. The wafer probing of VCSEL chips with SR (1-7 um) and without SR (0 um=conventional) VCSELs, was simultaneously done on the same wafer.

FIG. 14 illustrates static characteristics (e.g., LIV, FF Divergence and Linewidth of Optical Spectra) of wafer level selective probing according to certain example embodiments for first and second 4-inch wafers described in FIG. 10, and FIG. 11. Table 1400 illustrates parameters that may be used for a 20 nm depth target for the first wafer discussed in relation to FIG. 10. Table 1400 also illustrates parameters for the second wafer discussed in relation to FIGS. 11 and 12, at a target surface relief depth of 36 nm. Based upon the above, we disclose that dry etching as a function of surface relief depth through its diameter, increases output power, output current and slope efficiency (SE). In other words, depending upon the etch depth or phase of the standing wave optical field, surface relief structure offers tunable performance of static characteristics such as output power (Pf), series resistance (Rs) and slope efficiency (SE), and most importantly threshold current (ith) which comes from filtering of optical modes through phase of the surface relief structure. Thus surface relief structure functions as tunable optical phase filter. Moreover, the technique does not affect, or does not affect with sufficient significance to noticeably change behavior, operating voltage ($V_{op}$), far field pattern (FFP), spectrum width $\Delta\lambda$ and wavelength $\lambda$.

Figure 15:
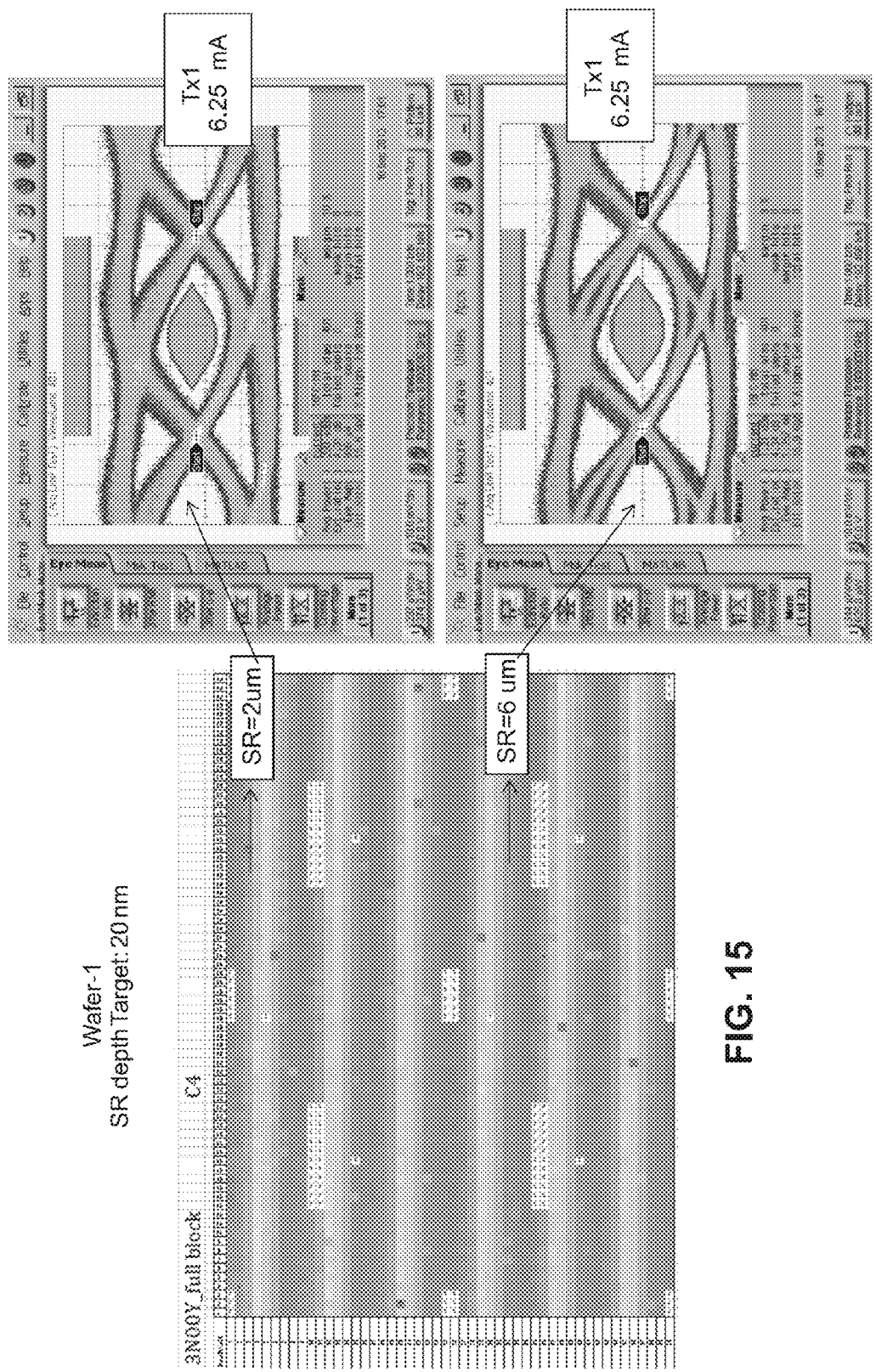
FIG. 15 illustrates some dynamic characteristics of transmission, and the use of eye diagram data, according to certain example embodiments.

FIG. 15 illustrates some dynamic characteristics of transmission, and the use of eye diagram data for the first wafer, according to certain example embodiments. Illustrated is first wafer 1502 of surface relief depth target of 20 nm, and the eye diagrams corresponding to the 2 um surface relief diameter, and the 6 um diameter. Both eye diagrams, 1504 and 1506 for surface relief diameters 2 um and 6 um respectively, indicate transmission at 6.25 mA bias current. Using embodiments described above, a 10 Gb/s designed VCSEL was operated at 16 Gb/s at 70 C, indicating the strong potential of surface relief structure in high-speed data transmission enabled by the embodiments.

FIG. 16A illustrates phase conditions for semiconductor step surface relief structures according to certain example embodiments. FIG. 16A illustrates an anti-phase surface relief design 1602 in which a stack of thin-film layers 1606, including one or more layers of p$^+$GaAs at the top, that is epitaxially grown on the top DBR 1604 as shown, such that the standing wave 1608 (i.e. standing wave corresponding to the VCSEL) is anti-phase in relation to the top surface of the top most DBR layer. The removal by etching of a portion of the one or more top most p$^+$GaAs layers creating a surface relief structure provides a stronger fundamental mode (FM).

This design offers the FM in focus and enables good control of FM at lower SR diameters (SR≈3.0 um) as shown by the curve 1610.

FIG. 16B illustrates phase conditions for semiconductor step surface relief structures. FIG. 16B illustrates an in-phase surface relief design 1622 in which a stack of thin-film layers 1626 including layers of p⁺GaAs 1628, a stack of p⁺AlGaAs 1630, and a stack of AlGaAs GRIN 1632 are epitaxially grown on the top DBR 1624, as shown, such that the standing wave 1638 (i.e. standing wave corresponding to the VCSEL) is in-phase in relation to the top surface of the top most DBR layer. The design in FIG. 16B also includes a surface relief of a larger diameter (SR≈6.0 um) and larger depth than that of FIG. 16A. This design offers both FM and higher order modes (HOM) in focus but not able to effectively control of HOM, as illustrated by the output curve 1640. The hollow downward pointing arrow in FIG. 16B in the top DBR area indicates the p-DBR extending from top most layer of DBR (at arrow tail) towards the oxide window (arrow point/tip).

FIG. 17A illustrate phase conditions for dielectric surface relief ring structures, according to certain example embodiments. FIG. 17A illustrates an anti-phase surface relief design 1702 in which a stack of thin-film layers 1706 including layers of p⁺GaAs 1712 and SiN ring layer(s) 1714 are grown on the top DBR 1704, as shown, such that the standing wave 1708 is anti-phase in relation to the top surface of the top most layer of the top DBR. This design too offers FM focus and enables good control of FM, as shown by the output curve 1710.

FIG. 17B illustrates phase conditions for another semiconductor surface relief ring structure. FIG. 17B illustrates an in-phase surface relief design 1722 in which a stack of thin film layers 1726 including a SiN ring 1728, a stack of p⁺GaAs layers 1730, and a stack of AlGaAs GRIN 1732 are grown on the top DBR 1724, as shown, such that the standing wave 1738 is in-phase in relation to the top surface of the top most layer of the top DBR. This design offers both FM and HOM in focus but not able to effectively control of HOM, as illustrated by the output curve 1740.

From FIGS. 16A, 16B and 17A, 17B, using step and ring surface relief structures both in in-phase and anti-phase conditions, it is observed that step & ring surface relief structures made from SiN material offers larger thickness margin of surface relief material to be etched out than that of GaAs material which is due to the fact that SiN offers larger optical thickness through its lower refractive index (2.0) character than GaAs that offers smaller optical thickness through its higher refractive index GaAs (3.5) character. Higher optical thickness for surface reliefs etch depth control is most preferred and favorable for 4-inch wafer level processing at industry scale device manufacturing for process repeatability and stability.

FIGS. 18A and 18B illustrate aspects of surface relief design and mode control, for 4-inch wafer level manufacturing of VCSELs at industry scale according to certain example embodiments. FIG. 18A illustrates the step surface relief design 1802, at anti-phase termination of p⁺⁺GaAs contact layer with a thickness of 0.07 um (70 nm) overlapped with optical modes 1804 relative to the distance from the center of VCSEL. Portion A in 1804 represents surface relief etched area to control fundamental mode 1805 and portion B in 1804 represents a flat area of p⁺GaAs contact layer without etching to suppress higher order modes 1806. As shown in table 1807, the STEP surface relief comprises a GaAs layer, Al_xGaAs layer, and Al_xGaAs GRIN layer, all arranged in anti-phase matched reflectivity condition on p-DBR 112. For best dynamic performance using this step surface relief, the top p⁺⁺GaAs contact layer with a thickness should be etched down to 20-40 nm and this is difficult to maintain on full 4-inch wafer level processing due to dry etching thickness tolerance±10.0 nm. The area outside the step surface relief would be thick enough to absorb emitted photons and may cause absorption leading to increased ith. Therefore, this approach may not be practical for industry high volume production/manufacturing point of view.

FIG. 18B illustrates the ring surface relief design 1822, at anti-phase termination of p⁺⁺GaAs contact layer with a thickness of 0.02 um (20 nm) and a SiN thickness of 0.097 um (97 nm) overlapped with optical modes 1824 relative to the distance from the center of VCSEL. VCSEL epitaxial growth is done upto 20 nm p⁺⁺GaAs contact layer by MOCVD process and SiN thickness 0.097 um (97 nm) would be deposited using PECVD process. This approach facilitates large etch depth thickness margin that is required for full 4-inch wafer level process controllability. Portion A in 1824 represents surface relief etched area to control fundamental mode 1825 and portion B in 1824 represents a flat area of p⁺⁺GaAs ring contact layer without etching to suppress higher order modes 1826. As shown in table 1827, the step surface relief comprises a SiN layer, p⁺⁺GaAs layer, Al_xGaAs layer, and Al_xGaAs GRIN layer, all arranged in anti-phase matched reflectivity condition on p-DBR 112. For best dynamic performance using this ring surface relief, the top SiN dielectric layer should be totally etched down to 97 nm and this is much easier to maintain on full 4-inch wafer level process controllability and repeatability. This approach can also be extended to step surface relief described in FIG. 18A with fixed (20 nm) thickness of p⁺⁺GaAs layer and additional deposition of 97 nm SiN layer. Therefore, this approach is highly practical for industry high volume production/manufacturing of VCSELs.

Figures 19A, 19B:
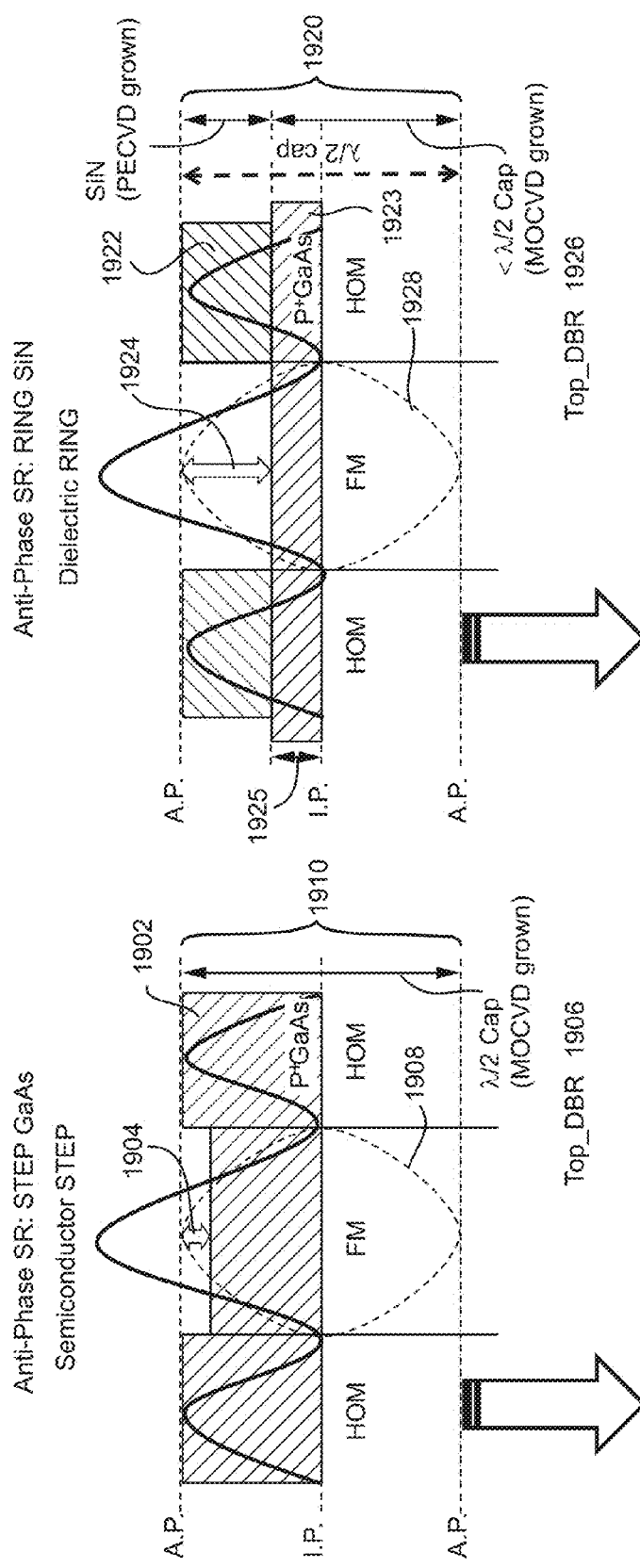
FIGS. 19A and 19B illustrate aspects of anti-phase terminated surface relief, respectively according to certain example embodiments.

FIG. 19A illustrates aspects of anti-phase terminated surface relief step, according to certain example embodiments. FIG. 19A illustrates a 40-50 nm deep cavity 1904 etched in a conventional p⁺⁺GaAs step design 1910 having a p⁺⁺GaAs layer 1902. The p⁺⁺GaAs semiconductor step design layer-1902 is epitaxially grown on the top DBR 1906 as shown such that the standing wave 1908 is terminated in an anti-phase manner by the top surface of the top most layer of the top DBR.

FIG. 19B illustrates aspects of anti-phase terminated surface relief ring, according to certain example embodiments. FIG. 19B illustrates a 100-150 nm deep cavity 1924 etched in a SiN ring design 1920 having a SiN ring 1922 formed over a stack of p⁺GaAs layers 1923. The invented dielectric SiN ring design 1922 layer is grown by PECVD on p⁺⁺GaAs contact layer window which sits on the top DBR 1926 such that the standing wave 1928 is terminated in an anti-phase manner at the top surface of the top most layer of the top DBR. As also shown in 16B, the top surface of the top most DBR layer is terminated in a layer having a fixed thickness 1925 in between the anti-phase and in-phase condition of the standing wave. For example, in embodiments, the un-etched top-most GaAs surface may be terminated in in-phase or anti-phase of the standing wave, and in an etched surface relief depth (e.g., 20-50 nm) to a fixed thickness in between in-phase to anti-phase condition. From FIGS. 19A and 19B it is clear that invented surface relief design using SiN ring shaped structure offers nearly twice the etch depth margin than conventional p⁺⁺GaAs surface relief design with step structure. Here the "fixed thickness" is thickness of epitaxially grown p++ GaAs layer in between anti-phase and in-phase conditions. As the optical thickness between anti-phase and in-phase conditions is a quarter of emission wavelength, any thickness in between comes out be less than quarter of emission wavelength.

Further FIG. 19B illustrate, among other things, certain advantages provided by certain example embodiments due to requiring epi-growth of less than λ/2 cap layers typically required by invented techniques for anti-phase terminated surface relief designs. In this case, anti-phase structure design offers larger etch depth margin. This anti-phase design may also be useful for single mode (SM) operation through effective mode control with large oxide aperture sizes (e.g., 6-12 um).

Figures 20A, 20B:
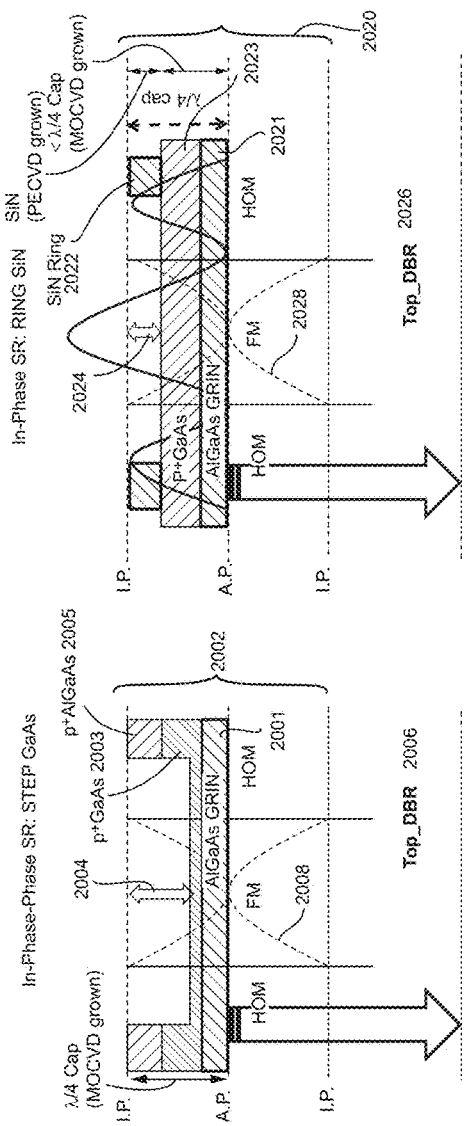
FIGS. 20A and 20B illustrate aspects of in-phase terminated surface relief, according to certain example embodiments.

FIGS. 20A and 20B illustrate aspects of in-phase terminated surface relief, according to certain example embodiments. FIG. 20A illustrates a 20-40 nm deep cavity 2004 etched in a step design 2002 which includes stacked layers of $p^{++}$GaAs 2005, $p^+$AlGaAs 2003, and AlGaAs GRIN 2001. The semiconductor step design 2002 is arranged above the top DBR 2006 such that the standing wave 2008 is terminated in an in-phase manner.

FIG. 20B illustrates a 40-55 nm deep cavity 2024 etched in a SiN ring design 2020 formed over a stack of SiN layers 2022, $p^+$GaAs layers 2023 and AlGaAs GRIN layers 2021 such that the standing wave 2028 is terminated in an in-phase manner.

FIG. 20B illustrates, among other things, certain advantages provided by embodiments due to requiring epi-growth of less than the λ/4 cap layers typically required by invented techniques for in-phase terminated surface relief designs. In both cases (20A and 20B), in-phase structure design offers smaller etch depth margin than anti-phase design shown in FIGS. 19A & 19B.

In summary, FIGS. 19A and 19B & 20A and 20B disclose the advantages of step or ring invented surface relief structures using SiN dielectric layer in comparison to the certain example embodiments of step or ring surface relief structures using $p^{++}$GaAs semiconductor layer. This is illustrated in Table-2100 of FIG. 21. Table 2100 illustrates surface relief in embodiments for PECVD grown SiN in both ring and step designs. For anti-phase case with SiN step or ring surface relief structures, etch depth would be 100-150 nm and for in-phase case with step or ring surface relief structures, etch depth would be 40-55 nm. For anti-phase case with p+ GaAs step or ring surface relief structures in conventional techniques, etch depth would be 40-50 nm and for in-phase case with step or ring surface relief structures, etch depth would be 20-40 nm. The fact that SiN layer refractive index is lower than GaAs and offers larger optical thickness, has an advantage to control etch depth using SiN layer in both anti-phase and in-phase step or ring structures, respectively. Therefore it is evident that PECVD grown SiN in i) both ring and step and ii) anti-phase and in-phase conditions offers nearly 2× (twice) etch depth thickness margin than epitaxially grown $p^{++}$GaAs layer.

In addition to the two times etch depth/thickness margin advantage described above, anti-phase terminated step or ring SR structures are also useful to filter the unwanted higher order optical modes through SR diameter control. The use of an anti-phase SR structure as a mode filter, offers higher power extraction by allowing only required modes through its diameter and filtering unwanted modes, enabling higher signal to noise ratio (SNR) to be achieved in at least some instances. In some example embodiments, the largest output power (SNR) can be achieved when the SR diameter is reduced to 2-4 um. Such example embodiments may have potential applications as sensors in optical finger navigation systems. Besides, anti-phase terminated step or ring SR structures may reduce spectral linewidth, which is beneficial for long distance transmission of light, for example 300-500 m in data center links.

For 850 nm VCSEL structures with a predetermined oxide window diameter between 7-8 um having in-phase design, 40 nm SR depth at 6.0 um SR diameter may provide an optimum combination to achieve max bandwidth.

For a 850 nm VCSEL structure with a predetermined oxide window diameter between 7-8 um, there often appears few lateral optical (both fundamental & higher order) modes in the optical spectra. In an in-phase design structure, all modes sees same gain and there is no phase filtering feature. However in an anti-phase design, in SR depth region, fundamental mode sees lower threshold gain and emits in non-SR region while higher order modes see higher threshold gain and gets suppressed. If the oxide window is large, mode filtering is weak, and if the oxide window is small, mode filtering is stronger. In certain example embodiments, by using anti-phase design SR diameter and oxide window diameters, unwanted higher order modes can be effectively suppressed, thereby increasing (and potentially maximizing) fundamental mode output signal.

Figure 22:
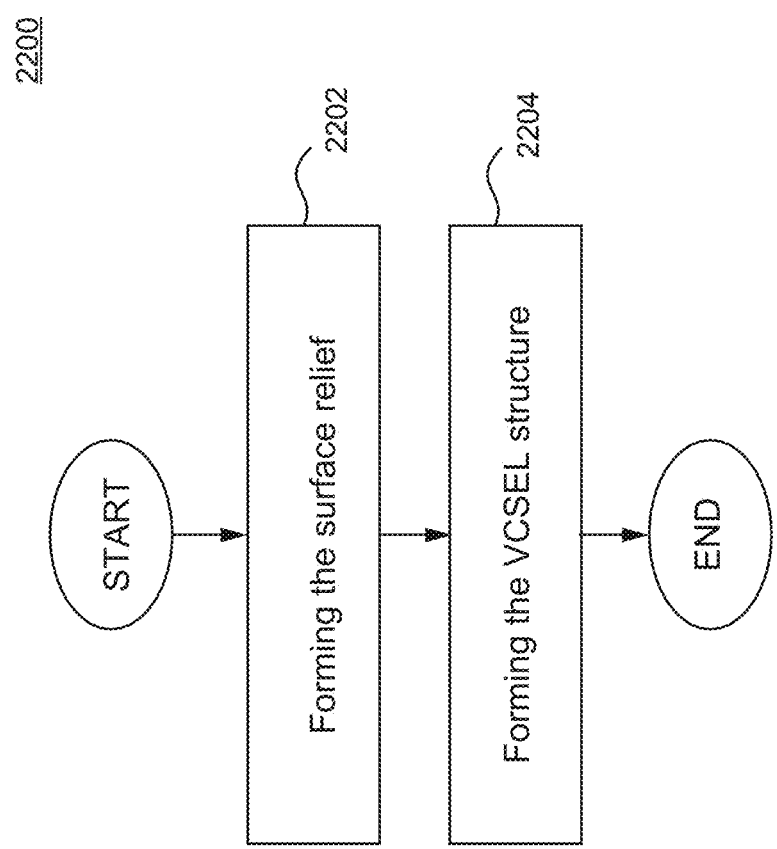
FIG. 22 illustrates a process for manufacturing an optical element according to certain example embodiments.

FIG. 22 provides a process 2200 of manufacturing an optical element integrated with a phase filter, according to certain example embodiments. For example, process 2200 may be performed in the manufacture of an optical element such as the optical elements 100 and 200.

At operation 2102, etching the surface relief structure on a surface of the top DBR is performed, in accordance with certain example embodiments. The surface relief structure can be any of that described in relation, for example, to FIGS. 1-2, 16-17, and/or 19-20. Additionally, before the etching, in certain example embodiments, one or more stacked layers, at least some of which will subsequently be subjected to surface relief dry or wet etching, are epitaxially grown on a surface of the top DBR effectively extending the top DBR. The compositions of the newly grown layers may include those described in relation, for example, to FIGS. 1-2, 16A, 16B, 17A-B, 19A, 19B and/or 20A-B.

At operation 2104, the VCSEL structure is formed. First, n-type multilayer film (a multilayer film in which, for example, n-type $Al_xGa_{1-x}As$ with different ratios are alternately stacked), which is to be the bottom DBR, a stacked layer (for example, one or more of GaAs, AlGaAs, InGaAs) which is to be the active layer, an oxide layer with an oxide window of a predetermined size, and p-type multilayer film in which p-type $Al_xGa_{1-x}As$ with different ratios are alternately stacked, which is to be the top DBR, are successively formed on n-type GaAs substrate. Mesa structure consisting of the bottom DBR, the active layer, and the top DBR, is formed by means of epitaxial or metal organic chemical vapor deposition. An anode electrode and cathode electrode are formed on the mesa structure (e.g., in a top-top configuration such as electrodes 118 and 120 shown in FIG. 1, or other configuration), respectively, by means of vapor deposition or thermal evaporation. Before p-contact metal deposition, surface relief structure would be formed on $p^{++}$GaAs contact layer.

Although not separately shown in FIG. 22, process 2200 may further include forming one or more contact layers. Moreover, the forming of the various layers and/or structures is performed in accordance with predetermined dimensions and/or shape requirements. The process may include all corresponding technical features of the VCSEL device described above, and obtains the same or corresponding technical effect achieved in the VCSEL device embodiments, which could be understood by persons skilled in the art when read through the description recited in the embodiments above, thus is omitted here.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A vertical cavity surface-emitting laser element (VCSEL), comprising:
   a top distributed Bragg reflector (DBR) and a bottom DBR each made with multiple layers of semiconductor thin films;
   an active region having at least one quantum well and at least one quantum well barrier each having a thickness of 3-10 nm formed between the top DBR and the bottom DBR, the at least one quantum well comprising InGaAs with an In composition of 0.04-0.12, the at least one quantum well barrier comprising $Al_xGaAs$ where x is between 0.3-0.4 or $GaAsP_y$ where y is between 0.2-0.3, wherein the at least one quantum well is adjusted for a photoluminescence emission target between 835-840 nm; and
   a surface relief structure formed on at least the top-most layer of the top DBR by dry or wet etching of semiconductor or dielectric thin films, wherein the surface relief structure has a depth of 20-150 nm and a diameter of 2-6 um, and the top surface of the top-most layer is terminated (1) either in-phase or anti-phase in relation to a standing wave corresponding to the VCSEL, and (2) in a layer having a fixed thickness in between the anti-phase and in-phase condition of the standing wave, wherein the depth of the etched surface relief structure has a non-quarter optical wave thickness [t≠n×L/4(η)], where t=thickness or depth in nm, n is an integer greater than or equal to 1, L is emission wavelength, and η is the refractive index of GaAs at the emission wavelength.

2. A vertical cavity surface-emitting laser element (VCSEL), comprising:
   a top distributed Bragg reflector (DBR) and a bottom DBR each made with multiple layers of semiconductor thin films;
   an active region having at least one quantum well and at least one quantum well barrier each having a thickness of 3-10 nm formed between the top DBR and the bottom DBR, the at least one quantum well comprising InGaAs with an In composition of 0.04-0.12, the at least one quantum well barrier comprising $Al_xGaAs$ where x is between 0.3-0.4 or $GaAsP_y$ where y is between 0.2-0.3, wherein the at least one quantum well is adjusted for a photoluminescence emission target between 835-840 nm; and
   a semiconductor step or ring surface relief structure having a depth of 20-50 nm and a diameter of 2-6 um formed on at least one top most layers of the top DBR, the top most layer being p-doped, and wherein the top-most layer is terminated (1) either in-phase or anti-phase in relation to a standing wave corresponding the VCSEL, and (2) in a layer having a fixed thickness in between the anti-phase and in-phase condition of the standing wave, wherein the depth of the etched surface relief structure has a non-quarter optical wave thickness [t≠n×L/4(η)], where t=thickness or depth in nm, n is an integer greater than or equal to 1, L is emission wavelength, and η is the refractive index of GaAs at the emission wavelength.

3. A vertical cavity surface-emitting laser element (VCSEL), comprising:
   a top distributed Bragg reflector (DBR) and a bottom DBR each made with multiple layers of semiconductor thin films;
   an active region having at least one quantum well and at least one quantum well barrier each having a thickness of 3-10 nm formed between the top DBR and the bottom DBR, the at least one quantum well comprising InGaAs with an In proportion of 0.04-0.12, the at least one quantum well barrier comprising $Al_xGaAs$ where x is between 0.3-0.4 or $GaAsP_y$ where y is between 0.2-0.3, wherein the at least one quantum well is adjusted for a photoluminescence emission target between 835-840 nm; and
   a dielectric step or ring surface relief structure having a depth of 20-150 nm and a diameter of 2-6 um formed on at least one top-most layer of the top DBR, the top-most layer being p-doped, wherein the surface relief structure is formed by wet chemical etching of dielectric layers fabricated on the at least one top-most layer, and wherein the top-most dielectric layer is terminated (1) either in-phase or anti-phase in relation to a standing wave corresponding the VCSEL, and (2) in a layer having a fixed thickness in between the anti-phase and in-phase condition of the standing wave, wherein the depth of the etched surface relief structure has a non-quarter optical wave thickness [t≠n×L/4(η)], where t=thickness or depth in nm, n is an integer greater than or equal to 1, L is emission wavelength, and η is the refractive index of GaAs at the emission wavelength.

4. The VCSEL according to claim 1, 2, or 3, wherein the emission wavelength is in the wavelength range of 850-860 nm such that a photoluminescence-laser emission offset lies between 10-25 nm.

5. The VCSEL according to claim 4, wherein the VCSEL includes both anode and cathode electrical contacts arranged as top-top configuration, and anode at top with cathode at bottom electrode contacts arranged as top-bottom configuration.

6. The VCSEL according to claim 4, wherein the VCSEL is grown on p-doped or n-doped or un-doped (semi-insulating) GaAs substrate.

7. The VCSEL according to claim 4, further comprising at least one $Al_xGa_{1-x}As$ oxidation layer with Al content of at least 98 percent with an aperture shape that is either circular or substantially circular in a center region of the oxide layer, and when multiple oxide layers are available, forming at least one oxide layer placed above and below optical cavity/gain region of the VCSEL.

8. The VCSEL according to claim 4, further comprising mesa passivation with low dielectric constant (∈) materials.

9. The VCSEL according to claim 8, wherein the low dielectric constant materials include one or more of SiN and BCB.

10. The VCSEL according to claim 2 or 3, wherein the emission wavelength is in the range of 850-860 nm, and wherein the diameter of the surface relief structure in anti-phase top surface termination is configured in relation to a diameter of an oxide aperture to filter lateral optical modes.

11. The VCSEL according to claim 1, wherein the surface relief structure is formed on the top-most layer and one or more layers consecutively below the top-most layer, wherein the layers in which the surface relief is formed includes one or more of P++GaAs contact, AlGaAs URN GRIN, or $Al_{0.12}GaAs$ layers.

12. The VCSEL according to claim 1, wherein the dry etching includes inductively coupled plasma reactive ion etching (ICP-RIE).

13. The VCSEL according to claim 3, wherein the dielectric layer comprises SiN.

14. A method of manufacturing a vertical cavity surface-emitting laser element (VCSEL), comprising:
forming a top distributed Bragg reflector (DBR), a bottom DBR and an active region, wherein the top and bottom DBRs each being with multiple layers of semiconductor thin films, and wherein the active region having at least one quantum well and at least one quantum well barrier each having a thickness of 3-10 nm formed between the top DBR and the bottom DBR, the at least one quantum well comprising InGaAs with an In proportion of 0.04-0.12, the at least one quantum well barrier comprising $Al_xGaAs$ where x is between 0.3-0.4 or $GaAsP_y$ where y is between 0.2-0.3, wherein the at least one quantum well is adjusted for a photoluminescence emission target between 835-840 nm; and
forming a surface relief structure formed on at least the top-most layer of the top DBR by dry or wet etching of semiconductor or dielectric thin films, wherein the surface relief structure has a depth of 20-150 nm and a diameter of 2-6 um, and the top surface of the top-most layer is terminated (1) either in-phase or anti-phase in relation to a standing wave corresponding the VCSEL, and (2) in a layer having a fixed thickness in between the anti-phase and in-phase condition of the standing wave,
wherein the depth of the etched surface relief structure has a non-quarter optical wave thickness [t≠n×L/4(η)], where t=thickness or depth in nm, n is an integer greater than or equal to 1, L is emission wavelength, and η is the refractive index of GaAs at the emission wavelength.

15. A method of manufacturing a vertical cavity surface-emitting laser element (VCSEL), comprising:
forming a top distributed Bragg reflector (DBR), a bottom DBR and an active region, wherein the top and bottom DBRs each being with multiple layers of semiconductor thin films, and wherein the active region having at least one quantum well and at least one quantum well barrier each having a thickness of 3-10 nm formed between the top DBR and the bottom DBR, the at least one quantum well comprising InGaAs with an In proportion of 0.04-0.12, the at least one quantum well barrier comprising $Al_xGaAs$ where x is between 0.3-0.4 or $GaAsP_y$ where y is between 0.2-0.3, wherein the at least one quantum well is adjusted for a photoluminescence emission target between 835-840 nm; and
forming a semiconductor step or ring surface relief structure having a depth of 20-50 nm and a diameter of 2-6 um formed on at least one top most layers of the top DBR, the top most layer being p-doped, and wherein the top-most layer is terminated (1) either in-phase or anti-phase in relation to a standing wave corresponding the VCSEL, and (2) in a layer having a fixed thickness in between the anti-phase and in-phase condition of the standing wave wherein the depth of the etched surface relief structure has a non-quarter optical wave thickness [t≠n×L/4(η)], where t=thickness or depth in nm, n is an integer greater than or equal to 1, L is emission wavelength, and η is the refractive index of GaAs at the emission wavelength.

16. A method of manufacturing a vertical cavity surface-emitting laser element (VCSEL), comprising:
forming a top distributed Bragg reflector (DBR), a bottom DBR and an active region, wherein the top and bottom DBRs each being with multiple layers of semiconductor thin films, and wherein the active region having at least one quantum well and at least one quantum well barrier each having a thickness of 3-10 nm formed between the top DBR and the bottom DBR, the at least one quantum well comprising InGaAs with an In proportion of 0.04-0.12, the at least one quantum well barrier comprising $Al_xGaAs$ where x is between 0.3-0.4 or $GaAsP_y$ where y is between 0.2-0.3, wherein the at least one quantum well is adjusted for a photoluminescence emission target between 835-840 nm; and
forming a dielectric step or ring surface relief structure having a depth of 20-150 nm and a diameter of 2-6 um on at least one top-most layer of the top DBR, the top-most layer being p-doped, wherein the surface relief structure is formed by wet chemical etching of dielectric layers fabricated on the at least one top-most layer, and wherein the top-most dielectric layer is terminated (1) either in-phase or anti-phase in relation to a standing wave corresponding the VCSEL, and (2) in a layer having a fixed thickness in between the anti-phase and in-phase condition of the standing wave, wherein the depth of the etched surface relief structure has a non-quarter optical wave thickness [t≠n×L/4(η)], where t=thickness or depth in nm, n is an integer greater than or equal to 1, L is emission wavelength, and η is the refractive index of GaAs at the emission wavelength.

17. The VCSEL according to claim 4, further comprising mesa passivation with low dielectric constant (∈) materials, wherein ∈<3.0.

18. The VCSEL according to claim 1, 2, or 3, wherein:
the surface relief structure is made directly on p+ GaAs without dielectric masks using UV lithography and ICP-RIE etching; and
GaAs material is used as both in-phase and anti-phase termination.

19. The method according to claim 14, 15, or 16, wherein:
the surface relief structure is made directly on p+ GaAs without dielectric masks using UV lithography and ICP-RIE etching; and
GaAs material is used as both in-phase and anti-phase termination.

* * * * *